United States Patent
Lee et al.

(10) Patent No.: US 12,308,363 B2
(45) Date of Patent: *May 20, 2025

(54) SEMICONDUCTOR PACKAGE

(71) Applicant: Samsung Electronics Co., Ltd., Suwon-si (KR)

(72) Inventors: Manho Lee, Hwaseong-si (KR); Eunseok Song, Hwaseong-si (KR); Keung Beum Kim, Hwaseong-si (KR); Kyung Suk Oh, Seongnam-si (KR); Eon Soo Jang, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/508,663

(22) Filed: Nov. 14, 2023

(65) Prior Publication Data

US 2024/0088118 A1    Mar. 14, 2024

Related U.S. Application Data

(63) Continuation of application No. 17/369,228, filed on Jul. 7, 2021, now Pat. No. 11,862,618.

(30) Foreign Application Priority Data

Nov. 20, 2020   (KR) .................. 10-2020-0157108

(51) Int. Cl.
    *H01L 25/18*    (2023.01)
    *H01L 23/00*    (2006.01)
    (Continued)

(52) U.S. Cl.
    CPC ............ *H01L 25/18* (2013.01); *H01L 23/481* (2013.01); *H01L 23/5226* (2013.01);
    (Continued)

(58) Field of Classification Search
    None
    See application file for complete search history.

(56) References Cited

U.S. PATENT DOCUMENTS

| 8,344,512 B2 | 1/2013 | Knickerbocker |
| 9,167,692 B2 | 10/2015 | Shimizu et al. |

(Continued)

FOREIGN PATENT DOCUMENTS

| EP | 3324436 A1 | 5/2018 |
| KR | 10-2016-0012589 A | 2/2016 |
| KR | 10-2020-0102928 A | 9/2020 |

OTHER PUBLICATIONS

Korean Office Action dated Mar. 21, 2025 issued in Korean Patent Application No. 10-2020-0157108.

*Primary Examiner* — Telly D Green
(74) *Attorney, Agent, or Firm* — Harness, Dickey & Pierce, P.L.C.

(57) ABSTRACT

A semiconductor package including a first semiconductor chip including a logic structure and a second semiconductor chip bonded to the first semiconductor chip may be provided. The first semiconductor chip may include signal lines on a first surface of a first semiconductor substrate and connected to the logic structure, a power delivery network on a second surface of the first semiconductor substrate, the second surface being opposite to the first surface, and penetration vias penetrating the first semiconductor substrate and connecting the power delivery network to the logic structure. The second semiconductor chip may include a capacitor layer that is on a second semiconductor substrate and is adjacent to the power delivery network.

19 Claims, 22 Drawing Sheets

(51) Int. Cl.
  *H01L 23/48*    (2006.01)
  *H01L 23/522*   (2006.01)
  *H01L 23/528*   (2006.01)
  *H10D 1/68*     (2025.01)
  *H10D 86/85*    (2025.01)

(52) U.S. Cl.
  CPC .......... *H01L 23/5286* (2013.01); *H01L 24/08* (2013.01); *H01L 24/16* (2013.01); *H10D 1/716* (2025.01); *H10D 86/85* (2025.01); *H01L 2224/08147* (2013.01); *H01L 2224/16147* (2013.01)

(56) References Cited

U.S. PATENT DOCUMENTS

| | | |
|---|---|---|
| 9,263,186 B2 | 2/2016 | Li et al. |
| 9,331,062 B1 | 5/2016 | Lane et al. |
| 9,349,713 B2 | 5/2016 | Kim et al. |
| 9,741,691 B2 | 8/2017 | Lim et al. |
| 10,068,899 B2 | 9/2018 | Melville et al. |
| 10,121,743 B2 | 11/2018 | Kamal et al. |
| 10,636,739 B2 | 4/2020 | Beyne et al. |
| 10,700,207 B2 | 6/2020 | Chen et al. |
| 10,741,486 B2 | 8/2020 | Reingruber et al. |
| 11,145,657 B1 | 10/2021 | Or-Bach et al. |
| 11,322,446 B2 | 5/2022 | Kim et al. |
| 11,444,068 B2 | 9/2022 | Song et al. |
| 2006/0087029 A1 | 4/2006 | Imanaka et al. |
| 2006/0289932 A1 | 12/2006 | Ahn et al. |
| 2007/0035030 A1 | 2/2007 | Horton et al. |
| 2011/0049673 A1 | 3/2011 | Chakravarti et al. |
| 2012/0112352 A1 | 5/2012 | Chi et al. |
| 2012/0292777 A1 | 11/2012 | Lotz |
| 2014/0021584 A1 | 1/2014 | Tu et al. |
| 2014/0154858 A1 | 6/2014 | Farmer et al. |
| 2014/0252544 A1 | 9/2014 | Li et al. |
| 2014/0327109 A1 | 11/2014 | Weng et al. |
| 2015/0102459 A1 | 4/2015 | Lai et al. |
| 2016/0379960 A1 | 12/2016 | Huang et al. |
| 2017/0323920 A1 | 11/2017 | Kumar et al. |
| 2018/0145030 A1 | 5/2018 | Beyne et al. |
| 2018/0330992 A1 | 11/2018 | DeLaCruz et al. |
| 2018/0331094 A1 | 11/2018 | DeLaCruz et al. |
| 2019/0148342 A1 | 5/2019 | Hu et al. |
| 2019/0148351 A1 | 5/2019 | Chen et al. |
| 2019/0378556 A1 | 12/2019 | Lim et al. |
| 2020/0219771 A1 | 7/2020 | DeLaCruz et al. |
| 2021/0118618 A1 | 4/2021 | Shin et al. |
| 2021/0175192 A1 | 6/2021 | Mueller et al. |
| 2021/0407942 A1 | 12/2021 | Yu et al. |
| 2022/0216185 A1 | 7/2022 | Kao et al. |
| 2022/0262778 A1 | 8/2022 | Yu et al. |

SEMICONDUCTOR PACKAGE

CROSS-REFERENCE TO RELATED APPLICATIONS

This U.S. non-provisional patent application is a continuation of U.S. application Ser. No. 17/369,228, filed on Jul. 7, 2021, which claims priority under 35 U.S.C. § 119 to Korean Patent Application No. 10-2020-0157108, filed on Nov. 20, 2020, in the Korean Intellectual Property Office, the entire contents of each of which are hereby incorporated by reference.

BACKGROUND

The present disclosure relates to semiconductor packages, and in particular, to semiconductor packages with improved operation characteristics.

A semiconductor package is configured to easily use a semiconductor chip as a part of an electronic product. In general, the semiconductor package includes a printed circuit board (PCB) and a semiconductor chip, which is mounted on the PCB and is electrically connected to the PCB by bonding wires or bumps. With development of electronics industry, many studies are being conducted to improve reliability of the semiconductor package and to reduce a size of the semiconductor package.

SUMMARY

An example embodiment of the inventive concepts provides a semiconductor package with improved operation characteristics.

According to an example embodiment of the inventive concepts, a semiconductor package may include a first semiconductor chip including a logic structure and a second semiconductor chip bonded to the first semiconductor chip. The first semiconductor chip may include signal lines on a first surface of a first semiconductor substrate and connected to the logic structure, a power delivery network on a second surface of the first semiconductor substrate, the second surface being opposite to the first surface, and penetration vias penetrating the first semiconductor substrate and connecting the power delivery network to the logic structure. The second semiconductor chip may include a capacitor layer that is on a second semiconductor substrate and is adjacent to the power delivery network.

According to an example embodiment of the inventive concepts, a semiconductor package may include a first semiconductor substrate, a second semiconductor substrate, a power delivery network between the first semiconductor substrate and the second semiconductor substrate, and a capacitor layer between the power delivery network and the second semiconductor substrate.

According to an example embodiment of the inventive concepts, a semiconductor package may include a first semiconductor substrate having a first surface and a second surface opposite to the first surface, active patterns on the first surface of the first semiconductor substrate, active contacts connected to the active patterns, signal lines on the active contacts and connected to the active contacts, buried power rails in the first semiconductor substrate and connected to the active patterns, penetration vias penetrating the first semiconductor substrate and connected to the buried power rails, a power delivery network on the second surface of the first semiconductor substrate, the power delivery network including power lines connected to the penetration vias, first bonding pads connected to the power delivery network, a capacitor layer including power decoupling capacitors on a third surface of a second semiconductor substrate, the third surface facing the power delivery network, and second bonding pads connected to the power decoupling capacitors. The first and second bonding pads may be bonded to each other.

According to an example embodiment of the inventive concepts, a semiconductor package may include a logic structure on a first semiconductor substrate, a capacitor layer including power decoupling capacitors on a second semiconductor substrate, and a power delivery network connected to the logic structure and the capacitor layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below.

These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which some example embodiments are shown.

Figure 1:
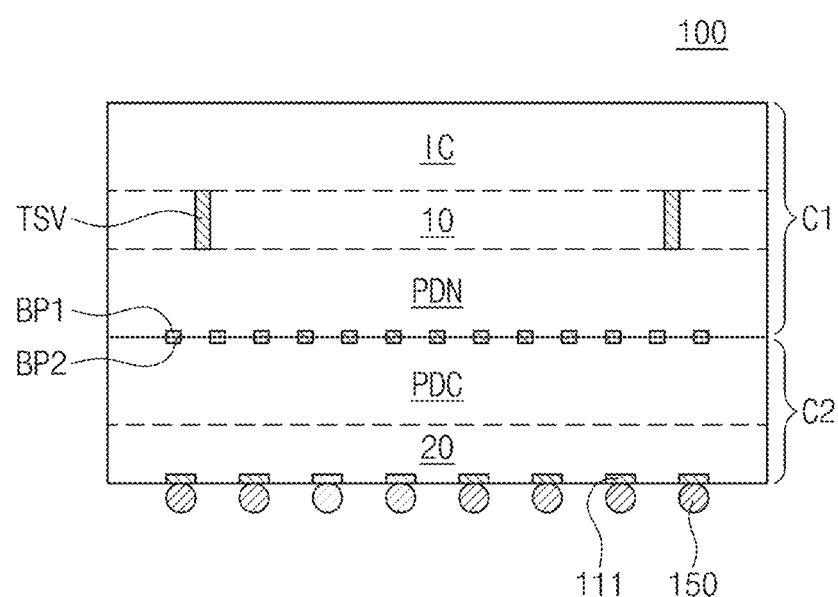
FIG. 1 is a schematic sectional view illustrating a semiconductor package according to an example embodiment of the inventive concepts.

FIG. 1 is a schematic sectional view illustrating a semiconductor package according to an example embodiment of the inventive concepts.

Referring to FIG. 1, a semiconductor package 100 may include a first semiconductor chip C1 including a logic structure IC and a second semiconductor chip C2 including a power decoupling capacitor.

The first semiconductor chip C1 may include a first semiconductor substrate 10, the logic structure IC provided on a first surface 10a of the first semiconductor substrate 10, a power delivery network PDN or a power distribution network, which is provided on a second surface of the first semiconductor substrate 10 and is connected to the logic structure IC through a plurality of penetration vias TSV, and first bonding pads BP1. The first bonding pads BP1 may be provided in the uppermost metal layer of the power delivery network PDN. The first semiconductor chip C1 may be a micro electro mechanical systems (MEMS) device, an optoelectronic device, or a logic chip including processors (e.g., a central processing unit (CPU), a graphic processing unit (GPU), a mobile application chip, or a digital signal processor (DSP)). In this disclosure, the terms "uppermost" and "lowermost" may refer to positions relative to a bottom surface of the semiconductor package 100 at which outer connection terminals 150 are attached, or positions relative to the bottom of each of the figures.

The second semiconductor chip C2 may include a second semiconductor substrate 20, a capacitor layer PDC provided on the second semiconductor substrate 20, and second bonding pads BP2. The second bonding pads BP2 may be provided in the uppermost metal layer of the capacitor layer PDC.

The semiconductor package 100 may include chip pads 111, which are provided on a bottom surface of the second semiconductor chip C2, and the outer connection terminals (or alternatively, connection terminals) 150 may be attached to the chip pads.

The semiconductor package 100 may be a chip-to-chip (C2C) structure, which is formed by fabricating the first semiconductor chip C1 on a first wafer, fabricating the second semiconductor chip C2 on a second wafer different from the first wafer, and connecting the first semiconductor chip C1 to the second semiconductor chip C2 in a bonding manner.

In the bonding manner, the first bonding pads BP1 of the first semiconductor chip C1 may be electrically connected to the second bonding pads BP2 of the second semiconductor chip C2. For example, in the case where the first and second bonding pads BP1 and BP2 are formed of copper (Cu), the bonding manner may be a Cu-to-Cu bonding manner, but in an example embodiment, the first and second bonding pads BP1 and BP2 may be formed of aluminum (Al) or tungsten (W).

In an example embodiment, the first and second semiconductor chips C1 and C2 may be connected to each other using connection terminals (not shown) (e.g., conductive bumps, conductive pillars, and solder balls), which are provided between the first and second bonding pads BP1 and BP2.

Figure 2:
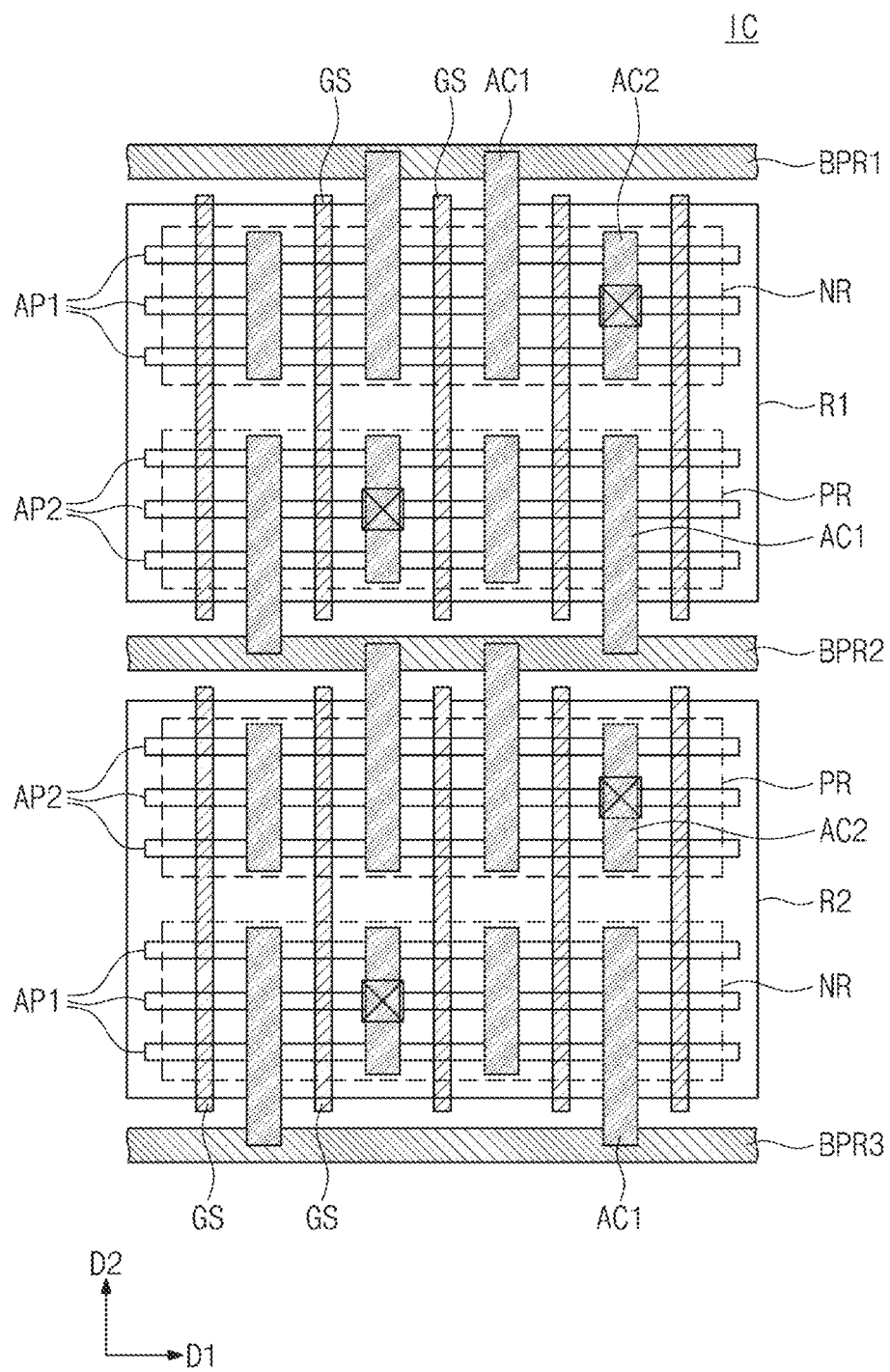
FIG. 2 is a layout diagram illustrating a logic structure of a semiconductor package according to an example embodiment of the inventive concepts.
Figure 3:
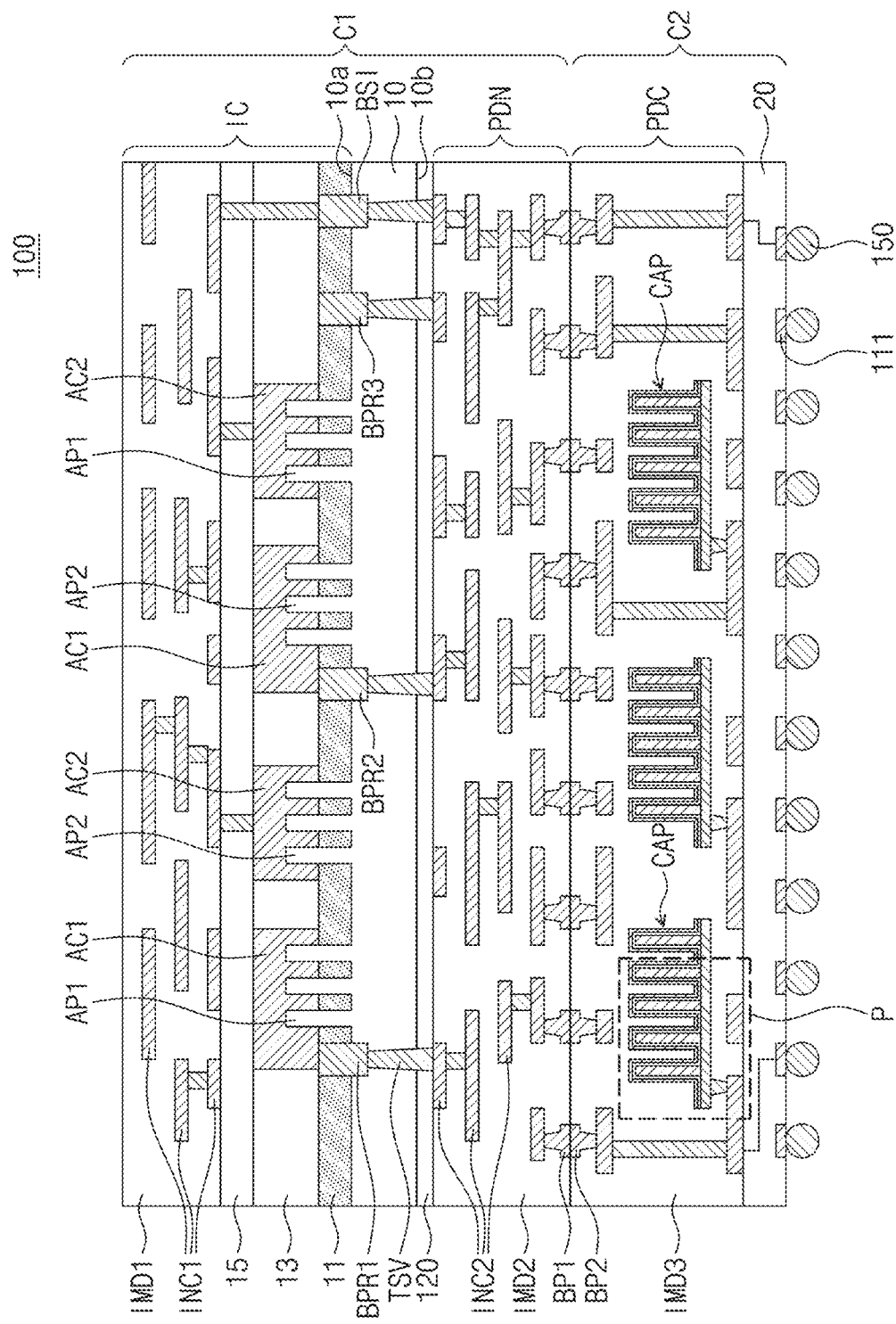
FIG. 3 is a sectional view illustrating a semiconductor package according to an example embodiment of the inventive concepts.
Figure 4A:
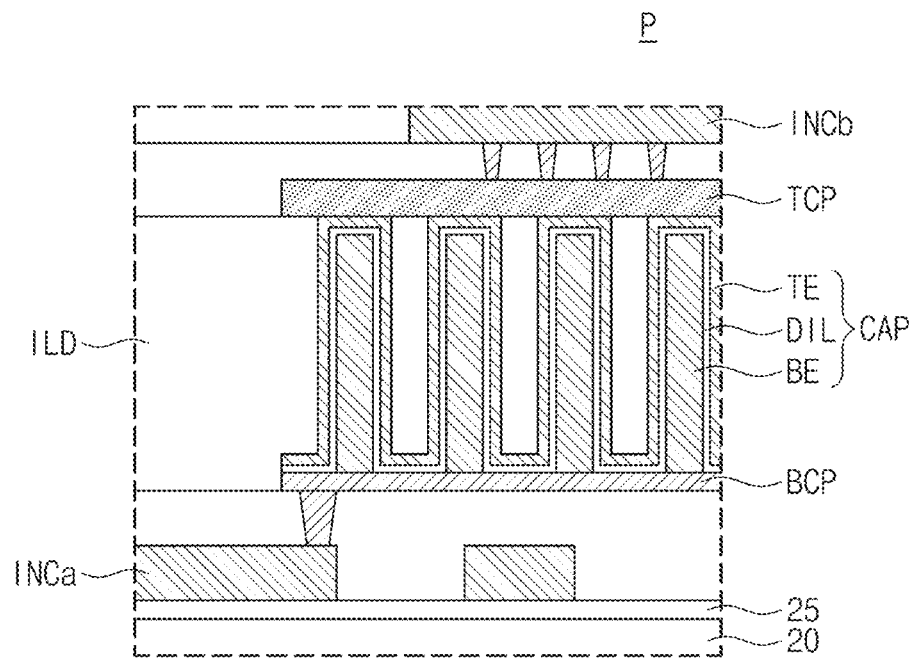
FIGS. 4A and 4B are enlarged sectional views illustrating a portion P of FIG. 3.
Figure 4B:
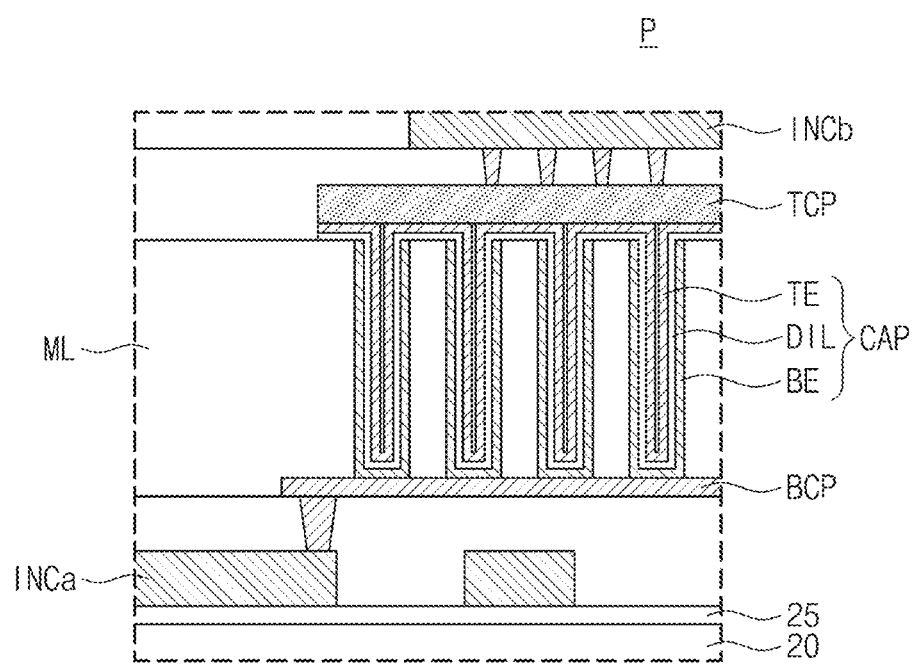

FIG. 2 is a layout diagram illustrating a logic structure of a semiconductor package according to an example embodiment of the inventive concepts. FIG. 3 is a sectional view illustrating a semiconductor package according to an example embodiment of the inventive concepts. FIGS. 4A and 4B are enlarged sectional views illustrating a portion P of FIG. 3.

Referring to FIGS. 2 and 3, the first semiconductor chip C1 may include the first semiconductor substrate 10, the logic structure IC, and the power delivery network PDN.

The logic structure IC may include logic devices, which are integrated on a first surface 10a of the first semiconductor substrate 10, and signal lines INC1, which are connected to the logic devices. The logic devices may include at least one of an AND circuit, an OR circuit, a NOR circuit, an inverter circuit, or a latch circuit. Further, the logic devices may include field effect transistors, resistors, or the like.

For example, the first semiconductor substrate 10 may be a silicon substrate, a germanium substrate, a silicon-germanium substrate, a silicon-on-insulator (SOI) substrate, or germanium-on-insulator (GOI) substrate. As an example, the first semiconductor substrate 10 may be a silicon wafer.

Buried power rails BPR1, BPR2, and BPR3 may be provided in the first semiconductor substrate 10. The buried power rails BPR1, BPR2, and BPR3 may be extended in a first direction D1 and parallel to each other. In an example embodiment, the buried power rails BPR1, BPR2, and BPR3 may include first, second, and third buried power rails BPR1, BPR2, and BPR3. The first and third buried power rails BPR1 and BPR3 may be interconnection lines, to which a power voltage is applied, and the second buried power rail BPR2 may be an interconnection line, to which a ground voltage is applied.

The first semiconductor substrate 10 may include a first logic circuit region R1 between the first and second buried power rails BPR1 and BPR2 and a second logic circuit region R2 between the second and third buried power rails BPR2 and BPR3.

Each of the first and second logic circuit regions R1 and R2 may include first and second active regions NR and PR. As an example, PMOS field effect transistors may be provided on the first active region NR, and NMOS field effect transistors may be provided on the second active region PR. The first and second active regions NR and PR of the first semiconductor substrate 10 may be doped with dopants of different conductivity types.

A plurality of first active patterns AP1 may be provided in the first active region NR to extend in the first direction D1 and may be spaced apart from each other in a second direction D2 crossing the first direction D1. A plurality of second active patterns AP2 may be provided in the second active region PR to extend in the first direction D1 and may be spaced apart from each other in the second direction D2. The first and second active patterns AP1 and AP2 may be portions of the first semiconductor substrate 10 and may be defined by first trenches, which are formed in the first semiconductor substrate 10. An example, in which three first active patterns AP1 are provided, is illustrated, but the number of the first active patterns AP1 is not limited thereto and is variously changed. This is the same for the second active patterns AP2.

In an example embodiment, each of the first and second active patterns AP1 and AP2 may include a plurality of channel patterns, which are vertically stacked to be spaced apart from each other. The stacked channel patterns may be vertically overlapped with each other. The channel patterns may be formed of or include at least one of silicon (Si), germanium (Ge), or silicon-germanium (SiGe).

A device isolation layer 11 may be disposed between the first active patterns AP1 and between the second active patterns AP2. The device isolation layer 11 may separate the first and second active patterns AP1 and AP2 from each other in the second direction D2. The first and second active patterns AP1 and AP2 may include upper portions, which are exposed by the device isolation layer 11. For example, the device isolation layer 11 may have a top surface that is located at a level lower than top surfaces of the first and second active patterns AP1 and AP2, and the upper portions of the first and second active patterns AP1 and AP2 may protrude above the top surface of the device isolation layer 11.

Gate structures GS may be extended in the second direction D2 to cross the first and second active patterns AP1 and AP2 of the first and second active regions NR and PR. The gate structures GS may be arranged with a uniform pitch. In other words, the gate structures GS may have substantially the same width and may be spaced apart from each other by a uniform distance in the first direction D1.

In the case where each of the first and second active patterns AP1 and AP2 includes the channel patterns that are vertically stacked, the gate structure GS may include a gate electrode (not shown), which is provided to surround each of the channel patterns. The gate electrode may be provided to face or cover top, bottom, and opposite side surfaces of each of the channel patterns. In other words, the logic device may be a three-dimensional field-effect transistor (e.g., MBCFET or GAAFET), in which the gate electrode is provided to three-dimensionally surround the channel patterns.

Furthermore, as shown in FIGS. 2 and 3, first and second active contacts AC1 and AC2 may be provided on the first and second active patterns AP1 and AP2 and at both sides of the gate structures GS. The active contacts AC1 and AC2 may be in direct contact with the first and second active patterns AP1 and AP2 or may be connected to the first and second active patterns AP1 and AP2 through source/drain patterns (not shown). Here, the source/drain patterns may be epitaxial patterns that are formed by a selective epitaxial growth process.

In an example embodiment, the active contacts AC1 and AC2 may include first active contacts AC1, which are connected to the first, second, and third buried power rails BPR1, BPR2, and BPR3, and second active contacts AC2, which are connected to the signal lines INC1.

The first, second, and third buried power rails BPR1, BPR2, and BPR3 may be partially buried in the first semiconductor substrate 10. The first, second, and third buried power rails BPR1, BPR2, and BPR3 may be provided in the device isolation layer 11. The first, second, and third buried power rails BPR1, BPR2, and BPR3 may be in direct contact with the first active contacts AC1. The first, second, and third buried power rails BPR1, BPR2, and BPR3 may have top surfaces that are located at a level lower than the top surfaces of the first and second active patterns AP1 and AP2.

A buried signal line BSI may be provided at the same level as the first, second, and third buried power rails BPR1, BPR2, and BPR3. Input/output signals, which are input through chip pads 111, may be delivered to the signal lines INC1 through the buried signal line BSI and the penetration via TSV.

A first interlayer insulating layer 13 may be provided to fill spaces between the gate structures GS and between the active contacts AC1 and AC2. The first interlayer insulating layer 13 may be provided to cover the first, second, and third buried power rails BPR1, BPR2, and BPR3 and the buried signal line BSI.

A second interlayer insulating layer 15 may be disposed on the first interlayer insulating layer 13. The signal lines INC1, which are electrically connected to the logic devices, may be provided on the second interlayer insulating layer 15. The signal lines INC1 may be electrically connected to the gate structures GS or the second active contacts AC2 through a plurality of contact plugs. The signal lines INC1 may include a plurality of metal lines, which are stacked with inter-metal insulating layers IMD1 interposed therebetween.

A surface insulating layer 120 may be disposed on a second surface 10b of the first semiconductor substrate 10, and the penetration vias TSV may be provided to penetrate the surface insulating layer 120 and the first semiconductor substrate 10 and may be coupled to the first, second, and third buried power rails BPR1, BPR2, and BPR3 and the buried signal line BSI. The penetration vias TSV may have a diameter of about 50 nm to about 150 nm. The penetration vias TSV may have a vertical length of about 300 nm to about 1 µm. Although not shown, an insulating layer (not shown) may be interposed between side surfaces of the penetration vias TSV and the first semiconductor substrate 10. The penetration vias TSV may be formed of or include at least one of metallic materials (e.g., W, WN, WC, Ti, TiN, Ta, TaN, Ru, Co, Mn, WN, Ni, or NiB).

The power delivery network PDN may be provided on the second surface 10b of the first semiconductor substrate 10. The power delivery network PDN may include a plurality of power lines INC2, which are stacked with inter-metal insulating layers IMD2 interposed therebetween. The power lines INC2 may be interconnection lines, which are used to deliver a power voltage or a ground voltage. The power lines INC2 may be electrically connected to the first, second, and third buried power rails BPR1, BPR2, and BPR3 through the penetration vias TSV, which are provided to penetrate the first semiconductor substrate 10. The power lines INC2 may be formed of or include at least one of metallic materials. The first bonding pads BP1 may be provided in the uppermost metal layer of the power delivery network PDN. The first bonding pads BP1 may be electrically connected to the power lines INC2. The first bonding pads BP1 may be formed of or include at least one of, for example, tungsten (W), aluminum (Al), copper (Cu), tungsten nitride (WN), tantalum nitride (TaN), or titanium nitride (TiN).

The second semiconductor chip C2 may include the capacitor layer PDC, which is integrated on the second semiconductor substrate 20.

The second semiconductor substrate 20 may be a semiconductor substrate including silicon, germanium, silicon-germanium, or the like or a compound semiconductor substrate. In an example embodiment, the second semiconductor substrate 20 may be a silicon wafer.

Referring to FIGS. 3, 4A, and 4B, the capacitor layer PDC may be provided on a front surface of the second semiconductor substrate 20 (e.g., a first surface of the second semiconductor substrate 20 facing the power delivery network PDN), and the chip pads 111 may be provided on a rear surface of the second semiconductor substrate 20 (e.g., a second surface of the second semiconductor substrate 20 opposite to the first surface of the second semiconductor substrate 20). The outer connection terminals 150 may be attached to the chip pads 111. The chip pads 111 may be formed of or include at least one of metallic materials (e.g., copper (Cu), nickel (Ni), cobalt (Co), tungsten (W), titanium (Ti), tin (Sn), or alloys thereof).

The capacitor layer PDC may include lower and upper interconnection lines INCa and INCb and power decoupling capacitors CAP. The lower and upper interconnection lines INCa and INCb may be formed of or include at least one of metallic materials (e.g., copper, tungsten, and/or titanium).

The power decoupling capacitors CAP may be arranged in rows and columns to form an array. The power decoupling capacitors CAP may include a plurality of capacitors that are connected in parallel to each other.

For example, referring to FIG. 4A, the power decoupling capacitor CAP may be provided between a bottom electrode pad BCP and a top electrode pad TCP and may include a plurality of bottom electrodes BE, a capacitor dielectric layer DIL, and a top electrode TE.

The bottom electrodes BE may have a pillar shape, as shown in FIG. 4A. The bottom electrodes BE may have top surfaces that are substantially coplanar with each other. The bottom electrodes BE may have a uniform top width.

The bottom electrodes BE may be arranged in a shape of zigzag or honeycomb on the bottom electrode pad BCP. Because the bottom electrodes BE are arranged in the zigzag or honeycomb shape, it may be easy to increase diameters of the bottom electrodes BE or it may be possible to increase an integration density of the bottom electrodes BE. As another example, the bottom electrodes BE may be spaced apart from each other by a specific distance in two different directions (e.g., first and second directions) and be arranged in a matrix shape.

The bottom electrodes BE may be connected in common to the bottom electrode pad BCP, and the bottom electrode pad BCP may be connected to the lower interconnection lines INCa through contact plugs. The lower interconnection lines INCa may be provided on the second semiconductor substrate 20 with an insulating layer 25 interposed therebetween.

The capacitor dielectric layer DIL may cover outer surfaces of the bottom electrodes BE with a uniform thickness. The capacitor dielectric layer DIL may also cover the bottom electrode pad BCP between the bottom electrodes BE.

The top electrode TE may be provided on the capacitor dielectric layer DIL to conformally cover the bottom electrodes BE. In an example embodiment, the top electrode TE may be provided on the capacitor dielectric layer DIL to fill a space between the bottom electrodes BE. The top electrode TE may cover an entirety of the bottom electrodes.

The bottom electrodes BE and the top electrode TE may be formed of or include at least one of high melting point metals (e.g., cobalt, titanium, nickel, tungsten, and molybdenum) and/or metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN)).

The capacitor dielectric layer DIL may be formed of at least one selected from the group consisting of metal oxides (e.g., $HfO_2$, $ZrO_2$, $Al_2O_3$, $La_2O_3$, $Ta_2O_3$, and $TiO_2$) and perovskite dielectric materials (e.g., $SrTiO_3$(STO), (Ba,Sr)$TiO_3$(BST), $BaTiO_3$, PZT, and PLZT) and may have a single- or multi-layered structure.

The top electrode pad TCP may be disposed on the top electrode TE. The top electrode pad TCP may be provided on an interlayer insulating layer ILD to be in direct contact with portions of the top electrode TE. The top electrode pad TCP may be formed of or include at least on one of conductive materials, which is different from the top electrode TE, or doped semiconductor materials. The top electrode pad TCP may be formed of or include at least one of, for example, doped polysilicon, silicon germanium, and/or metals (e.g., tungsten, copper, aluminum, titanium, and tantalum).

As another example, referring to FIG. 4B, each of the bottom electrodes BE of the power decoupling capacitor CAP may have a cylindrical shape including a bottom portion and a sidewall portion, which is vertically extended from the bottom portion to define an empty space. Each of the bottom electrodes BE may have a cup shape conformally covering inner surfaces of openings of a mold insulating layer ML. The capacitor dielectric layer DIL and the top electrode TE may be sequentially disposed on the mold insulating layer ML to conformally cover the bottom electrodes BE. The capacitor dielectric layer DIL may be formed to cover inner surfaces of the bottom electrodes BE with a uniform thickness. The top electrode TE may be provided on the capacitor dielectric layer DIL to cover the bottom electrodes BE. Further, the top electrode TE may cover a surface of the capacitor dielectric layer DIL with a uniform thickness. In an example embodiment, the top electrode TE may be provided to define gap regions in the openings of the mold insulating layer ML.

Referring back to FIG. 3, the power decoupling capacitors CAP may be electrically connected to the chip pads 111 and the second bonding pads BP2 through the lower and upper interconnection lines INCa and INCb.

The second bonding pads BP2 may be provided in the uppermost metal layer of the capacitor layer PDC. The second bonding pads BP2 may be directly bonded to the first bonding pads BP1 of the first semiconductor chip C1. Further, a surface of an insulating layer IMD3 of the capacitor layer PDC may be directly bonded to a surface of an insulating layer IMD2 of the power delivery network PDN. In other words, the first and second semiconductor chips C1 and C2 may be bonded to have a hybrid bonding structure. The hybrid bonding structure may mean a bonding structure, in which two materials of the same kind are fused at an interface therebetween.

Figure 5A:
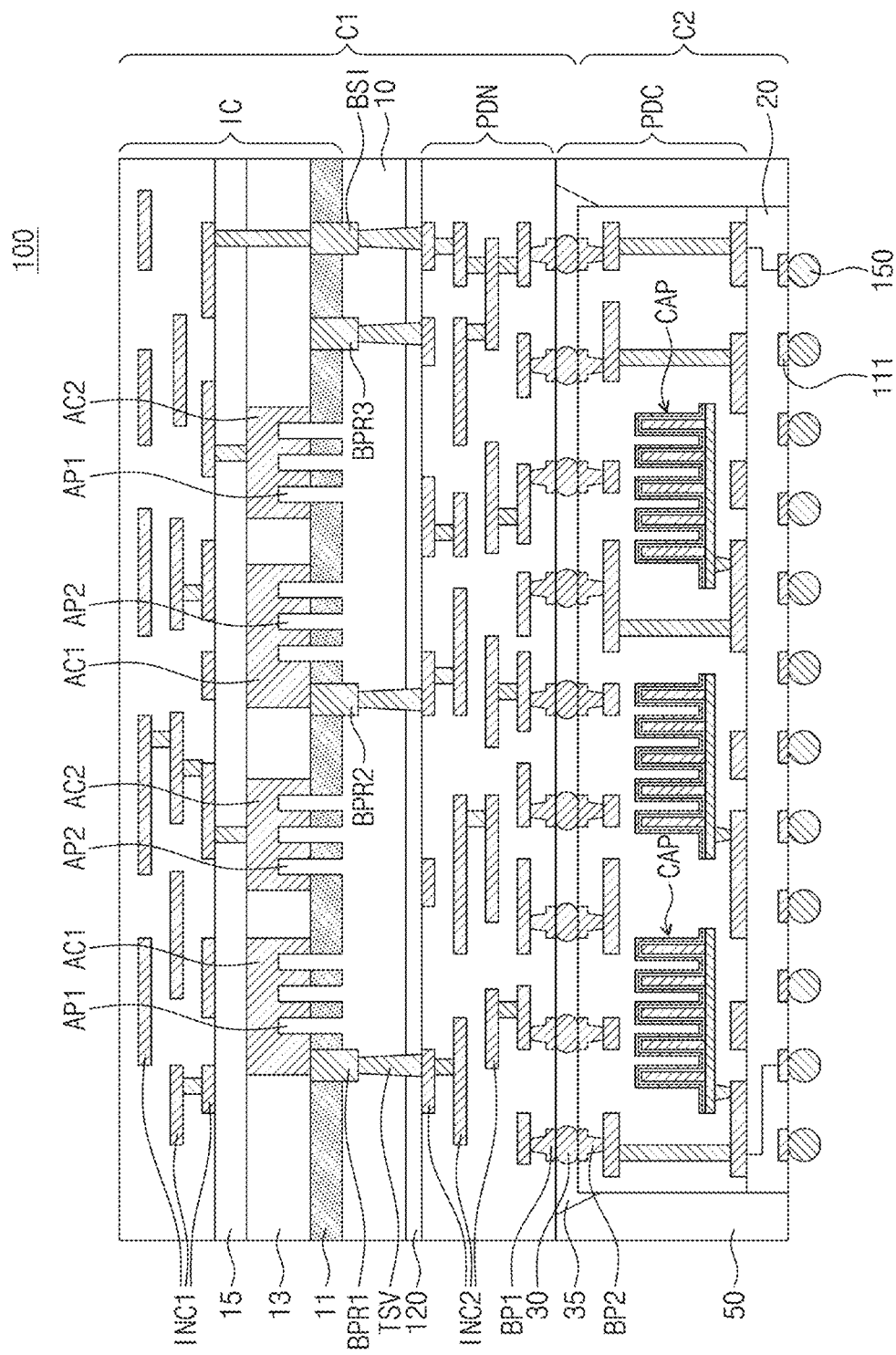
FIGS. 5A and 5B are sectional views illustrating a semiconductor package according to an example embodiment of the inventive concepts.
Figure 5B:
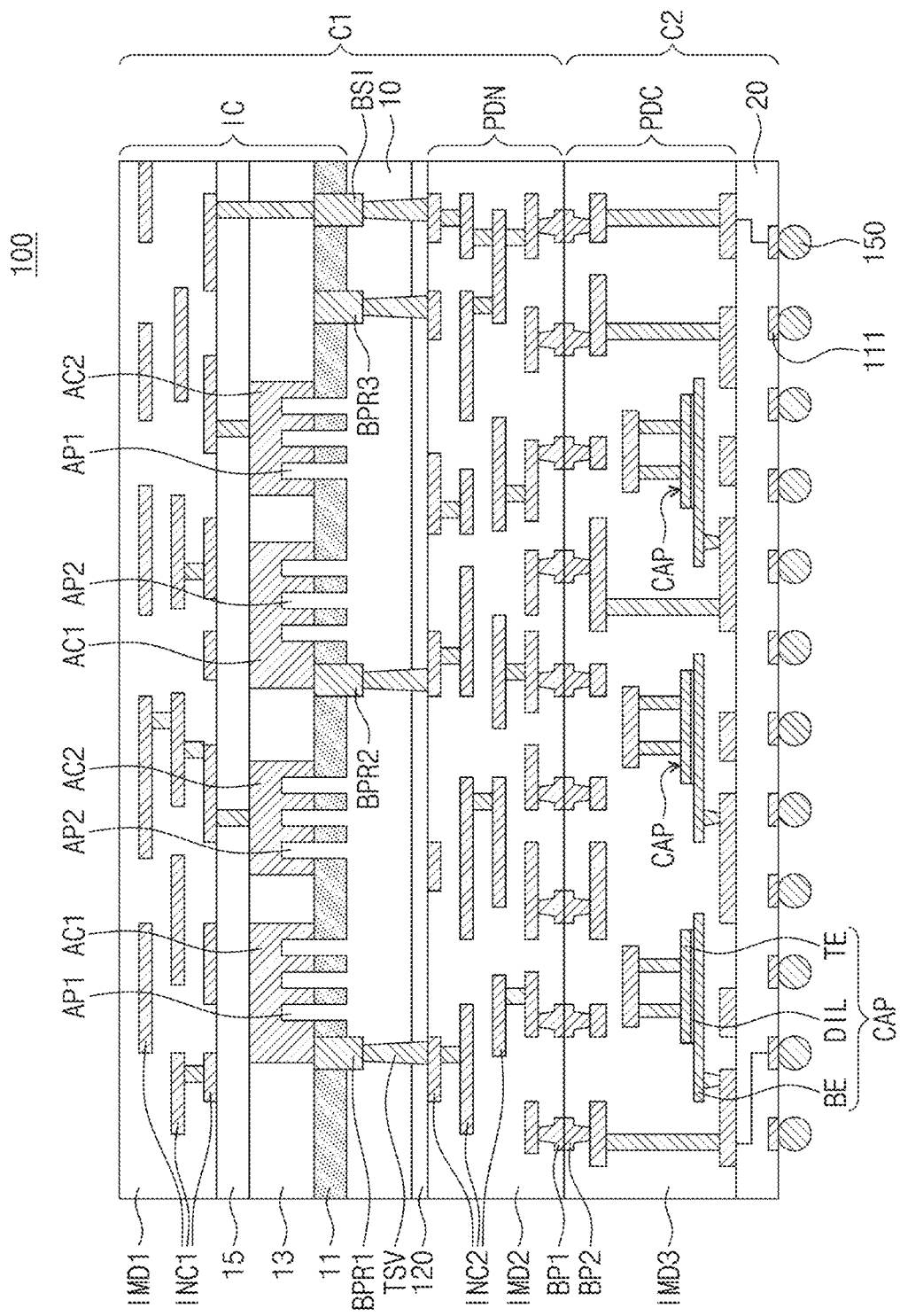

FIGS. 5A and 5B are sectional views illustrating a semiconductor package according to an example embodiment of the inventive concepts.

According to the example embodiment shown in FIG. 5A, the semiconductor package 100 may include the first and second semiconductor chips C1 and C2, connection terminals 30 therebetween, and a mold layer 50. The first and second semiconductor chips C1 and C2 may be configured to have substantially the same technical features as the first and second semiconductor chips C1 and C2 described with reference to FIG. 3, and thus a detailed description thereof may be omitted.

The connection terminals 30 may be provided between and attached to the first bonding pads BP1 of the first semiconductor chip C1 and the second bonding pads BP2 of the second semiconductor chip C2. An under-fill layer 35 may be provided to fill a space between the first and second semiconductor chips C1 and C2 and between the connection terminals 30.

The under-fill layer 35 may be formed of or include at least one of, for example, thermosetting resins or photo-curable resins. The under-fill layer 35 may include an inorganic filler or an organic filler. As another example, the under-fill layer 35 may be omitted, and the mold layer 50 may be provided to fill a space between the first and second semiconductor chips C1 and C2.

The mold layer 50 may be provided on the power delivery network PDN of the first semiconductor chip C1 to cover the second semiconductor chip C2. The mold layer 50 may have a side surface that is aligned to a side surface of the first semiconductor chip C1. The mold layer 50 may have a top surface that is substantially coplanar with the rear surface (or a bottom surface) of the second semiconductor substrate 20. The mold layer 50 may be formed of or include at least one of insulating polymers (e.g., an epoxy molding compound). In the case where the under-fill layer 35 is omitted, the space between the first and second semiconductor chips C1 and C2 may be filled with the mold layer 50.

According to the example embodiment shown in FIG. 5B, the semiconductor package 100 may include the first and second semiconductor chips C1 and C2 that are bonded to each other, and the first semiconductor chip C1 may include the first semiconductor substrate 10, the logic structure IC, and the power delivery network PDN, as described with reference to FIG. 3.

The second semiconductor chip C2 may include the capacitor layer PDC integrated on the second semiconductor substrate 20. In an example embodiment, the capacitor layer PDC may include the lower and upper interconnection lines INCa and INCb and metal-insulator-metal (MIM) capacitors CAP.

For example, the MIM capacitors CAP may include the bottom electrode BE, the top electrode TE, and the capacitor dielectric layer DIL therebetween. The bottom electrode BE, the capacitor dielectric layer DIL, and the top electrode TE may be disposed to be parallel to a top surface of the second semiconductor substrate 20.

The bottom electrode BE may be connected to the lower interconnection lines through the contact plugs. The bottom electrode BE may be formed by depositing a metal layer on an insulating layer and patterning the metal layer.

The capacitor dielectric layer DIL and the top electrode TE may be sequentially stacked on the bottom electrode BE. The top electrode TE may be connected to the upper interconnection lines through the contact plugs.

Figure 6:
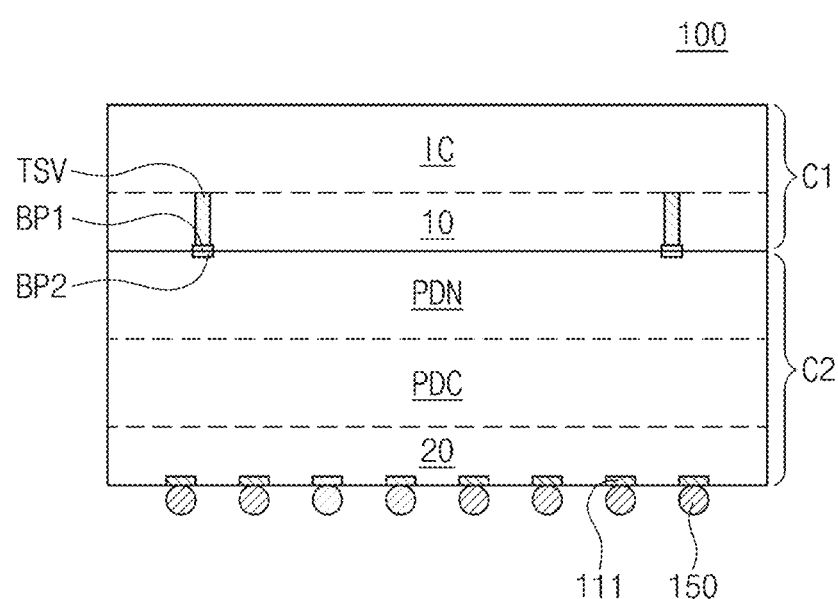
FIG. 6 is a schematic sectional view illustrating a semiconductor package according to an example embodiment of the inventive concepts.
Figure 7:
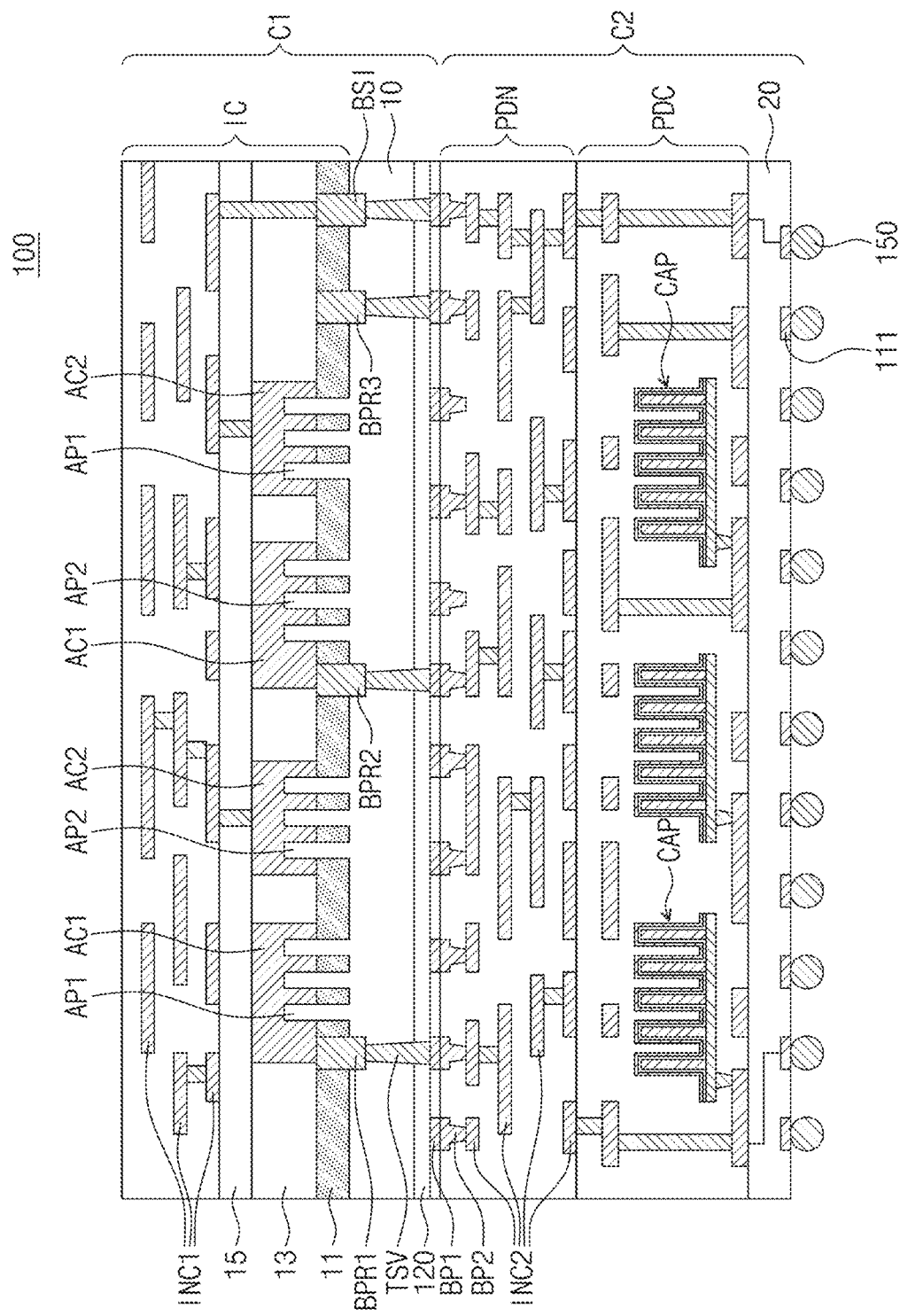
FIG. 7 is a sectional view illustrating a semiconductor package according to an example embodiment of the inventive concepts.

FIG. 6 is a schematic sectional view illustrating a semiconductor package according to an example embodiment of the inventive concepts. FIG. 7 is a sectional view illustrating a semiconductor package according to an example embodiment of the inventive concepts. For concise description, elements previously described with reference to FIGS. 1 to 5 may be identified by the same reference number without repeating an overlapping description thereof.

Referring to FIGS. 6 and 7, the semiconductor package 100 may include the first and second semiconductor chips C1 and C2, which are bonded to each other. Here, the first semiconductor chip C1 may include the logic structure IC, and the second semiconductor chip C2 may include the capacitor layer PDC and the power delivery network PDN.

The first semiconductor chip C1 may include the first semiconductor substrate 10, the logic structure IC, which is provided on the first surface of the first semiconductor substrate 10, the penetration vias TSV, which penetrates the first semiconductor substrate 10 and are connected to the logic structure IC, and the first bonding pads BP1, which are provided on the second surface of the first semiconductor substrate 10. A polymer layer, which is formed of or includes an insulating material, may be provided between the first bonding pads BP1.

The surface insulating layer 120 may be disposed on the second surface of the first semiconductor substrate 10, and the penetration vias TSV may penetrate the surface insulating layer 120 and the first semiconductor substrate 10 and may be connected to the first, second, and third buried power rails BPR1, BPR2, and BPR3 and the buried signal line BSI.

The second semiconductor chip C2 may include the second semiconductor substrate 20, the capacitor layer PDC, which is provided on the second semiconductor substrate 20, the power delivery network PDN, which is provided on the capacitor layer PDC, and the second bonding pads BP2. The second bonding pads BP2 may be provided in the uppermost metal layer of the power delivery network PDN.

The capacitor layer PDC may include the lower and upper interconnection lines INCa and INCb and the power decoupling capacitors CAP, as described above.

The power delivery network PDN may include the power lines INC2, which are stacked with inter-metal insulating layers interposed therebetween. The power lines INC2 may be electrically connected to the lower and upper interconnection lines INCa and INCb and the power decoupling capacitors CAP of the capacitor layer PDC through the contact plugs. The power delivery network PDN may be electrically connected to the first, second, and third buried power rails BPR1, BPR2, and BPR3 of the first semiconductor chip C1 through the first and second bonding pads BP1 and BP2.

The semiconductor package 100 may include the chip pads 111, which are provided on the bottom surface of the second semiconductor chip C2, and connection terminals 150 may be attached to the chip pads 111.

Figure 8:
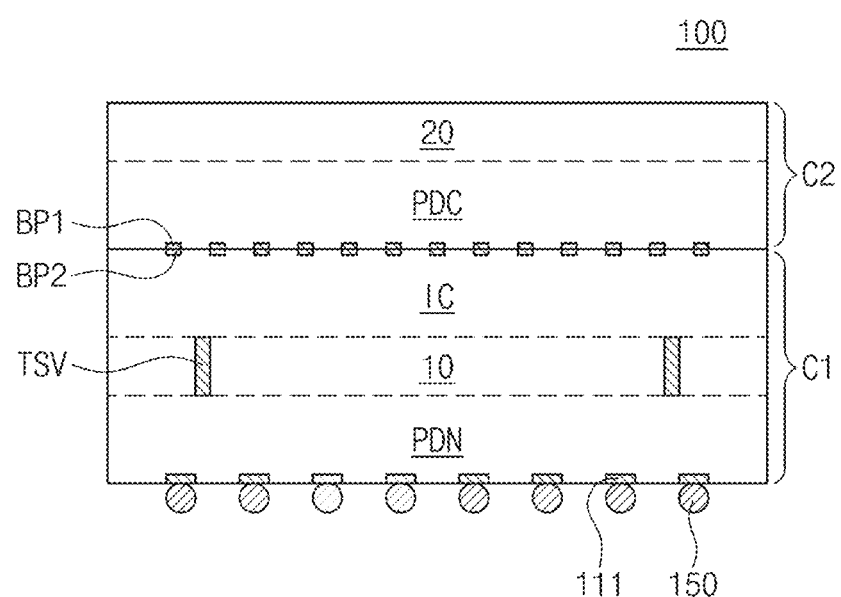
FIG. 8 is a schematic sectional view illustrating a semiconductor package according to an example embodiment of the inventive concepts.
Figure 9:
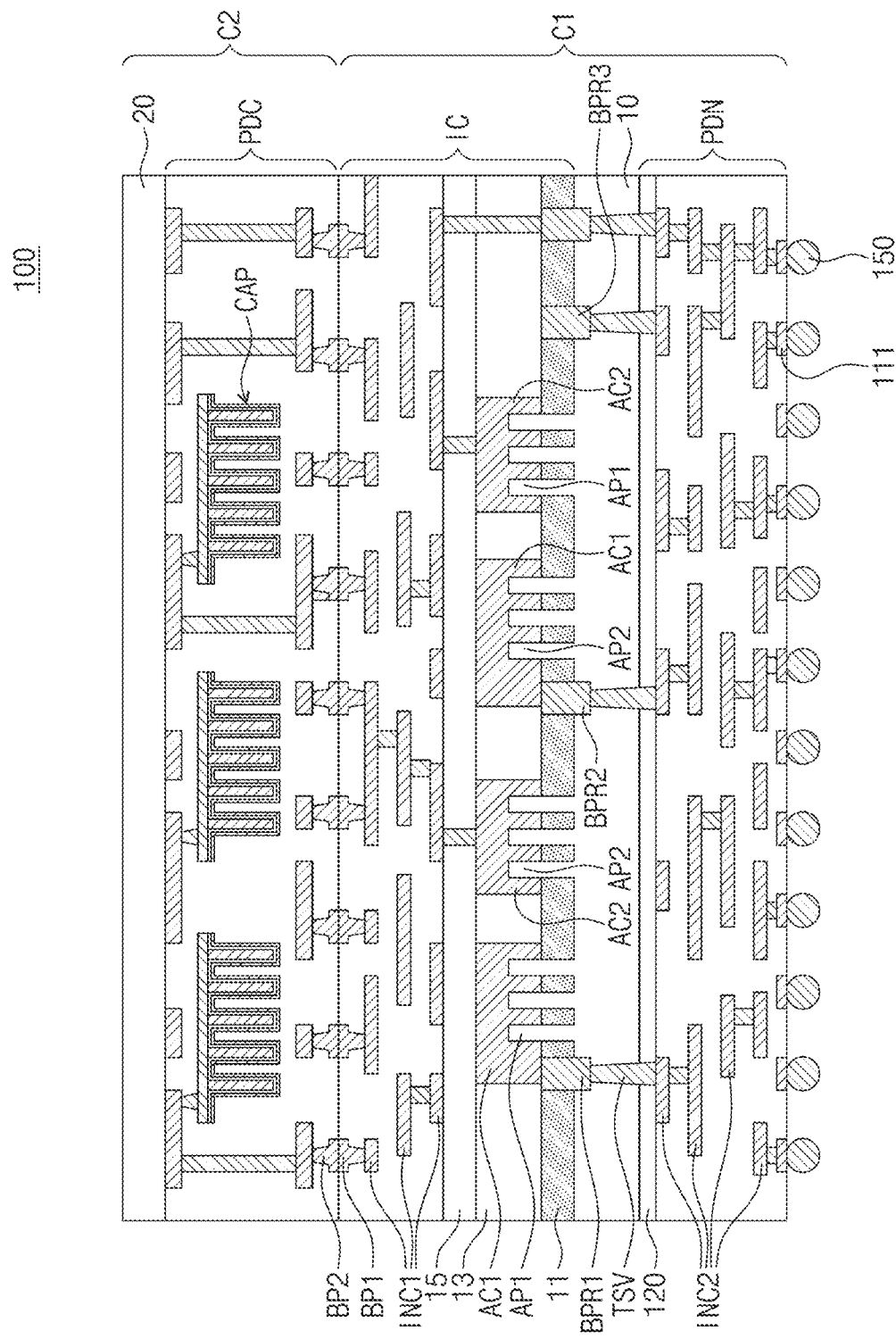
FIG. 9 is a sectional view illustrating a semiconductor package according to an example embodiment of the inventive concepts.

FIG. 8 is a schematic sectional view illustrating a semiconductor package according to an example embodiment of the inventive concepts. FIG. 9 is a sectional view illustrating a semiconductor package according to an example embodiment of the inventive concepts.

Referring to FIGS. 8 and 9, the first semiconductor chip C1 may include the first semiconductor substrate 10, the logic structure IC, and the power delivery network PDN, and the second semiconductor chip C2 may include the second semiconductor substrate 20 and the capacitor layer PDC. The first semiconductor chip C1 may include the first bonding pads BP1, which are provided in the uppermost metal layer of the logic structure IC, and the second semiconductor chip C2 may include the second bonding pads BP2, which are provided in the lowermost metal layer of the capacitor layer PDC. The first and second bonding pads BP1 and BP2 of the first and second semiconductor chips C1 and C2 may be bonded to each other.

Further, the first semiconductor chip C1 of the semiconductor package 100 may include the chip pads 111, which are provided in the lowermost metal layer of the power delivery network PDN.

The power delivery network PDN of the first semiconductor chip C1 may be provided on the second surface (e.g., a bottom surface) of the first semiconductor substrate 10 and may be electrically connected to the first, second, and third buried power rails BPR1, BPR2, and BPR3 through the penetration vias TSV.

Figure 10:
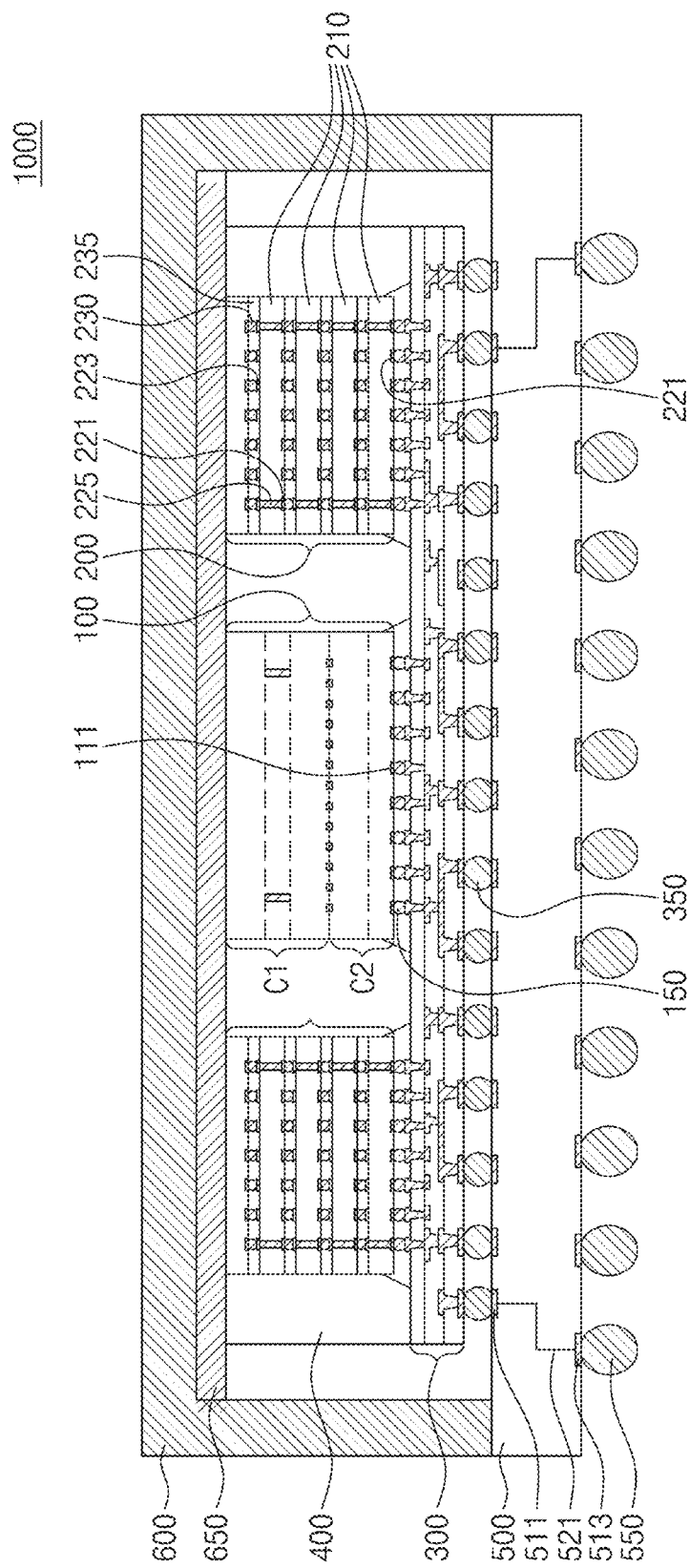
FIG. 10 is a sectional view illustrating a semiconductor package module including a semiconductor package, according to an example embodiment of the inventive concepts.

FIG. 10 is a sectional view illustrating a semiconductor package module including a semiconductor package, according to an example embodiment of the inventive concepts.

Referring to FIG. 10, a semiconductor package module 1000 may include the first semiconductor package 100, second semiconductor packages 200, a redistribution substrate 300, a package substrate 500, and a heat-dissipation structure 600. The first and second semiconductor packages 100 and 200 may be disposed on a top surface of the redistribution substrate 300.

The first semiconductor package 100 may have substantially the same structure as the semiconductor package 100 in the previously-described example embodiment. For example, the first semiconductor package 100 may include the first and second semiconductor chips C1 and C2, which are bonded to each other, and the first and second semiconductor chips C1 and C2 may include the logic structure IC and the capacitor layer PDC, respectively.

The second semiconductor packages 200 may be disposed on the redistribution substrate 300 to be spaced apart from the first semiconductor package 100. Each of the second semiconductor packages 200 may include a plurality of memory chips 210, which are vertically stacked. The memory chips 210 may be electrically connected to each other through lower and upper chip pads 221 and 223, chip through vias 225, and connection bumps 230. The memory chips 210 may be stacked on the redistribution substrate 300 in such a way that side surfaces thereof are aligned to each other. An adhesive layer may be provided between each adjacent pair of the memory chips 210. For example, the adhesive layer may be a polymer tape including an insulating material. The adhesive layer may be interposed between the connection bumps 230 to mitigate or prevent a short circuit issue from occurring between the connection bumps 230.

The first and second semiconductor packages 100 and 200 may be connected to the redistribution substrate 300 through first connection terminals 150. The first connection terminals 150 may be attached to the lower chip pads 111 and 221 of the first and second semiconductor packages 100 and 200. The first connection terminals 150 may include at least one of solder balls, conductive bumps, or conductive pillars. The first connection terminals 150 may be formed of or include at least one of copper, tin, or lead. For example, the first connection terminals 150 may have a thickness of about 30 µm to about 70 µm.

A mold layer 400 may be provided on the redistribution substrate 300 to cover the first and second semiconductor packages 100 and 200. A side surface of the mold layer 400 may be aligned to a side surface of the redistribution substrate 300. A top surface of the mold layer 400 may be substantially coplanar with top surfaces of the first and second semiconductor packages 100 and 200. The mold layer 400 may be formed of or include at least one of insulating polymers (e.g., an epoxy molding compound).

A first under-fill layer may be interposed between the first semiconductor package 100 and the redistribution substrate 300 and between the second semiconductor packages 200 and the redistribution substrate 300. The first under-fill layer may be provided to fill a space between the first connection terminals 150. The first under-fill layer may be formed of or include at least one of, for example, thermosetting resins or photo-curable resins. The first under-fill layer may further include an inorganic filler or an organic filler. In an example embodiment, the first under-fill layer may be omitted, and the spaces between the first and second semiconductor packages 100 and 200 and the redistribution substrate 300 may be filled with the mold layer 400.

The redistribution substrate 300 may be disposed on the package substrate 500 and may be connected to the package substrate 500 through second connection terminals 350. The redistribution substrate 300 may include a plurality of insulating layers, which are sequentially stacked, and redistribution patterns, which are provided in each of the insulating layers. The redistribution patterns, which are provided in different insulating layers, may be electrically connected to each other through via portions.

The second connection terminals 350 may be attached to lower pads of the redistribution substrate 300. The second connection terminals 350 may be solder balls, which are formed of tin, lead, copper, or the like. The second connection terminals 350 may have a thickness of about 40 µm to about 80 µm.

The package substrate 500 may be, for example, a printed circuit board, a flexible substrate, a tape substrate, or the like. In an example embodiment, the package substrate 500 may be one of a flexible printed circuit board, a rigid printed circuit board, or combinations thereof, in which internal lines 521 are provided.

The package substrate 500 may have a top surface and a bottom surface, which are opposite to each other, and may include upper coupling pads 511, outer coupling pads 513, and the internal lines 521. The upper coupling pads 511 may be arranged on the top surface of the package substrate 500, and the outer coupling pads 513 may be arranged on the bottom surface of the package substrate 500. The upper coupling pads 511 may be electrically connected to the outer coupling pads 513 through the internal lines 521. Outer coupling terminals 550 may be attached to the outer coupling pads 513. A ball grid array (BGA) may be provided as the outer coupling terminals 550.

The heat-dissipation structure 600 may be formed of or include at least one of thermally conductive materials. The thermally conductive materials may include metallic materials (e.g., copper and/or aluminum) or carbon-containing materials (e.g., graphene, graphite, and/or carbon nanotube). The heat-dissipation structure 600 may have a relatively high thermal conductivity. As an example, a single metal layer or a plurality of stacked metal layers may be used as the heat-dissipation structure 600. As another example, the heat-dissipation structure 600 may include a heat sink or a heat pipe. As other example, the heat-dissipation structure 600 may be realized using a water cooling method.

A heat conduction layer 650 may be interposed between the first and second semiconductor packages 100 and 200 and the heat-dissipation structure 600. The heat conduction layer 650 may be in contact with the top surfaces of the first and second semiconductor packages 100 and 200 and a bottom surface of the heat-dissipation structure 600. The heat conduction layer 650 may be formed of or include a thermal interface material (TIM). The thermal interface material may include, for example, polymer and thermally conductive particles. The thermally conductive particles may be dispersed in the polymer. During the operation of the semiconductor package, heat produced in the semiconductor package may be transferred to the heat-dissipation structure 600 through the heat conduction layer 650.

FIGS. 11 to 15 are sectional views illustrating a method of fabricating a semiconductor package, according to an example embodiment of the inventive concepts.

Figure 11:
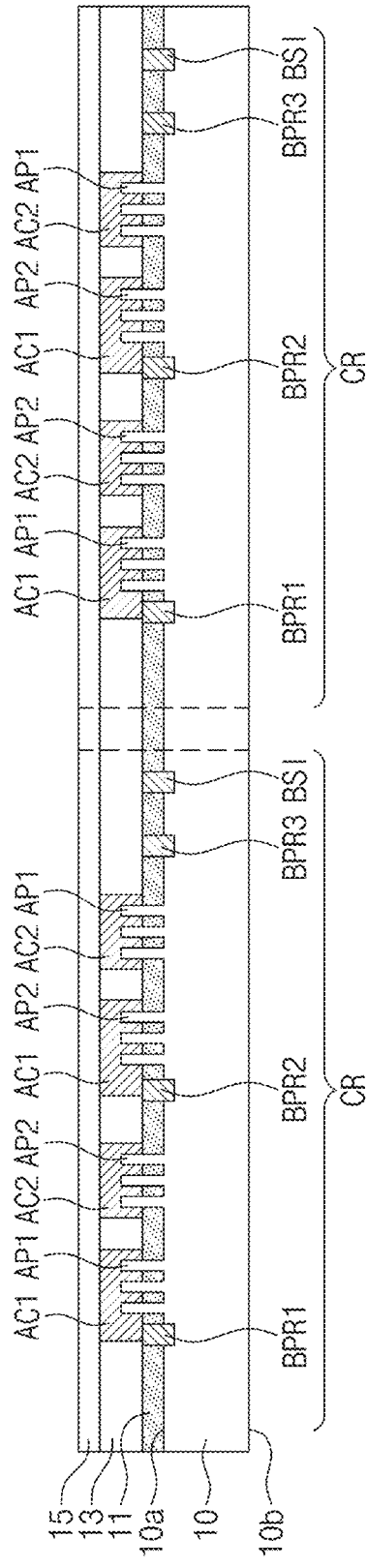
FIGS. 11 to 15 are sectional views illustrating a method of fabricating a semiconductor package, according to an example embodiment of the inventive concepts.

Referring to FIG. 11, the first semiconductor substrate 10 may be provided. For example, the first semiconductor substrate 10 may be a silicon substrate. The first semiconductor substrate 10 may include chip regions CR and a scribe line region between the chip regions CR. The first semiconductor substrate 10 may include the first surface 10a and the second surface 10b, which are opposite to each other.

In each of the chip regions CR, the first and second active patterns AP1 and AP2 may be formed on the first surface 10a of the first semiconductor substrate 10. The first and second active patterns AP1 and AP2 may be line-shaped patterns, which are extended in the first direction D1 and parallel to each other, as previously described with reference to FIG. 2. The first and second active patterns AP1 and AP2 may be defined by trenches, which are formed by patterning the first semiconductor substrate 10. For example, the first and second active patterns AP1 and AP2 may be portions of the first semiconductor substrate 10, which are defined by the trenches formed in the first semiconductor substrate 10.

The device isolation layer 11 may be formed between the first and second active patterns AP1 and AP2. The device isolation layer 11 may be formed to have a top surface, which is lower than top surfaces of the first and second active patterns AP1 and AP2, and thereby to expose upper portions of the first and second active patterns AP1 and AP2.

The first, second, and third buried power rails BPR1, BPR2, and BPR3 and the buried signal line BSI may be formed before or after the formation of the first and second active patterns AP1 and AP2. The first, second, and third buried power rails BPR1, BPR2, and BPR3 and the buried signal line BSI may be formed of or include at least one of metallic materials (e.g., tungsten, aluminum, titanium tantalum, titanium nitride, tantalum nitride, and/or tungsten nitride).

The first, second, and third buried power rails BPR1, BPR2, and BPR3 and the buried signal line BSI may be formed by patterning the device isolation layer 11 and the first semiconductor substrate 10 to form trenches, filling the trenches with a metal layer, and recessing (or planarizing) the metal layer.

The first, second, and third buried power rails BPR1, BPR2, and BPR3 and the buried signal line BSI may have top surfaces that are located at a level lower than the top surfaces of the first and second active patterns AP1 and AP2. The first, second, and third buried power rails BPR1, BPR2, and BPR3 and the buried signal line BSI may have bottom surfaces that are located at a level lower than a bottom surface of the device isolation layer 11.

The gate structures GS (e.g., see FIG. 2) and the active contacts AC1 and AC2 may be formed after the formation of the first, second, and third buried power rails BPR1, BPR2, and BPR3 and the buried signal line BSI. The active contacts AC1 and AC2 may be formed to penetrate the first interlayer insulating layer 13 and to be in contact with the first or second active patterns AP1 or AP2. Each of the active contacts AC1 and AC2 may include a barrier metal layer and a metal layer. The active contacts AC1 and AC2 may be formed to have top surfaces that are substantially coplanar with a top surface of the first interlayer insulating layer 13.

The second interlayer insulating layer 15 may be formed on the first interlayer insulating layer 13 to cover the top surfaces of the active contacts AC1 and AC2.

Figure 12:
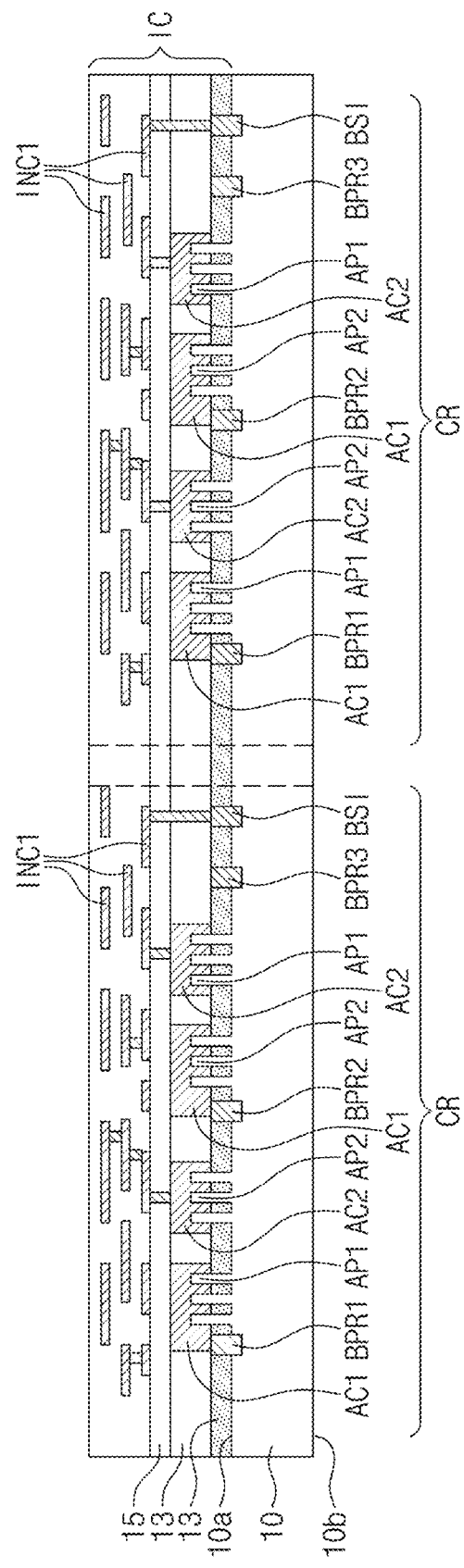

Referring to FIG. 12, the signal lines INC1 may be stacked on the second interlayer insulating layer 15 with an inter-metal insulating layer interposed therebetween. The signal lines INC1, which are vertically stacked, may be electrically connected to each other through contact plugs.

Figure 13:
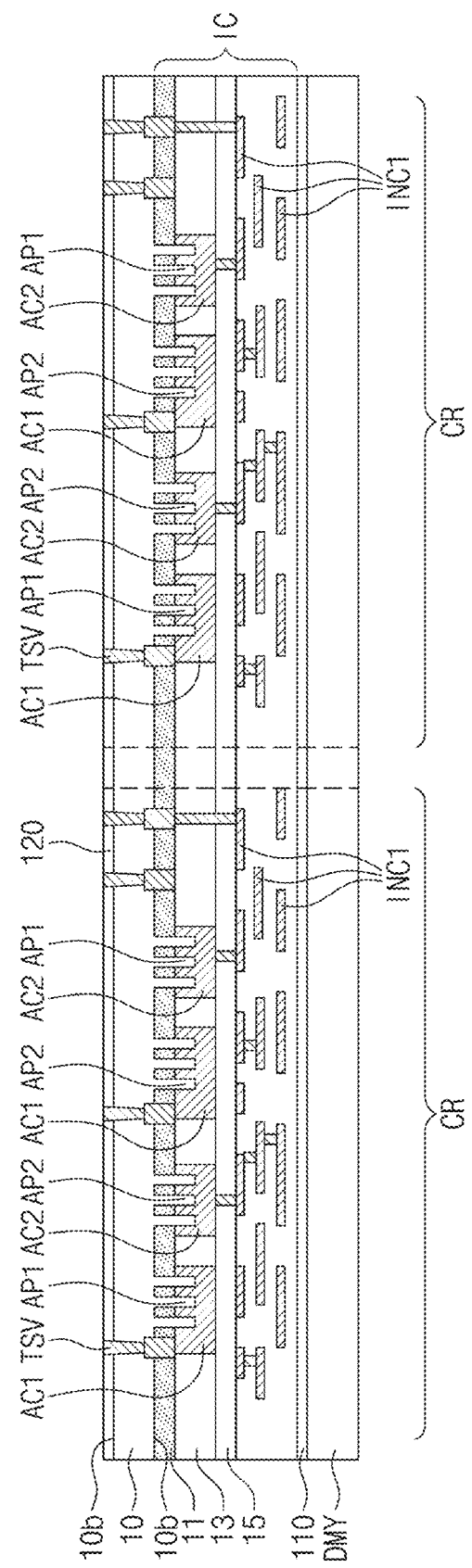

Referring to FIG. 13, a thinning process may be performed to reduce a thickness of the first semiconductor substrate 10. The thinning process may include grinding or polishing the second surface 10b of the first semiconductor substrate 10 and anisotropically and/or isotropically etching the first semiconductor substrate 10.

For the thinning process on the first semiconductor substrate 10, a dummy substrate DMY may be attached to the uppermost insulating layer of the logic structure IC using an adhesive layer 110. After the attachment of the dummy substrate DMY, the first semiconductor substrate 10 may be vertically inverted. A portion of the first semiconductor substrate 10 may be removed by the grinding or polishing process, and then, the anisotropic or isotropic etching process may be performed to remove surface defects from the remaining portion of the first semiconductor substrate 10.

The surface insulating layer 120 may be formed on the second surface 10b of the first semiconductor substrate 10, and then, the second surface 10b of the first semiconductor substrate 10 may be patterned to form penetration holes exposing the first, second, and third buried power rails BPR1, BPR2, and BPR3 and the buried signal line BSI. The penetration holes may be formed to have a vertical length of about 1 μm or less. Next, a metallic material may be formed to fill the penetration holes, and the penetration vias TSV may be formed by planarizing the metallic material to expose the surface insulating layer 120.

Figure 14:
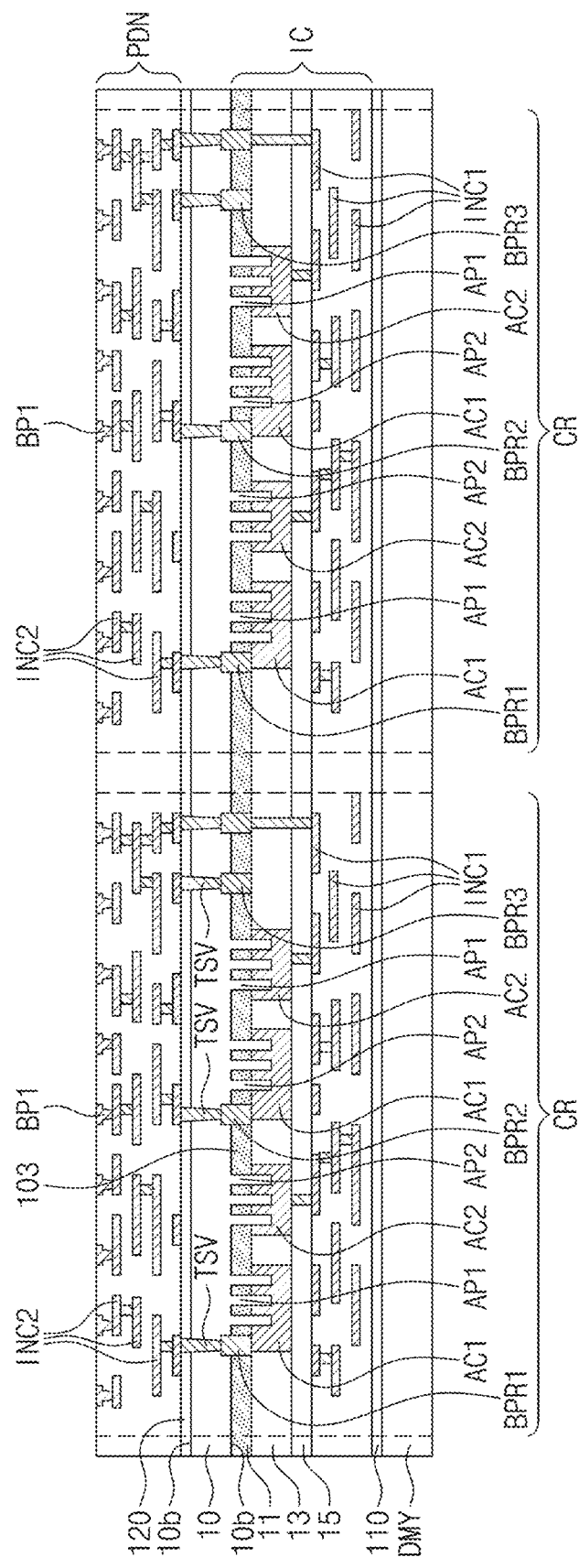

Referring to FIG. 14, the power delivery network PDN may be formed on the surface insulating layer 120. The formation of the power delivery network PDN may include forming the power lines INC2 with inter-metal insulating layers interposed therebetween. Further, the first bonding pads BP1 may be formed in the uppermost metal layer of the power delivery network PDN. The first bonding pads BP1 may be electrically connected to the power lines INC2.

Figure 15:
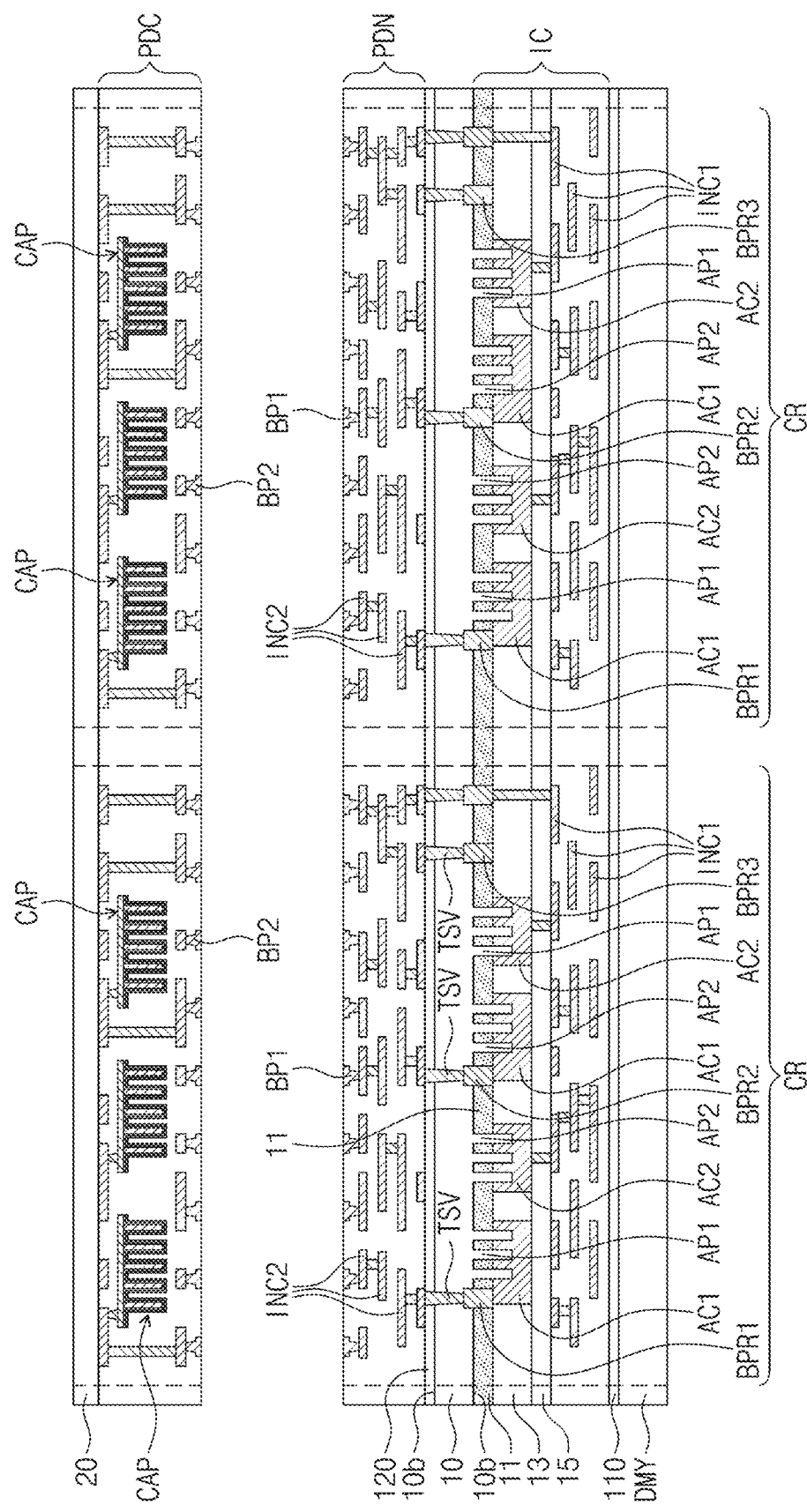

Referring to FIG. 15, the second semiconductor substrate 20 including the capacitor layer PDC may be provided on the power delivery network PDN.

For example, the second semiconductor substrate 20 may be a silicon substrate. The second semiconductor substrate 20 may include the chip regions CR and the scribe line region between the chip regions CR, similar to the first semiconductor substrate 10.

The power decoupling capacitors CAP may be formed on the chip regions CR of the second semiconductor substrate 20. The lowermost metal layer of the capacitor layer PDC may include the second bonding pads BP2.

The second semiconductor substrate 20 may be aligned to the first semiconductor substrate 10 such that the chip regions CR of the first semiconductor substrate 10 are vertically overlapped with the chip regions CR of the second semiconductor substrate 20.

The first bonding pads BP1 and the second bonding pads BP2 may be disposed to correspond to each other and may be directly bonded to each other. The first and second bonding pads BP1 and BP2 may be formed of or include at least one of tungsten (W), aluminum (Al), copper (Cu), tungsten nitride (WN), tantalum nitride (TaN), or titanium nitride (TiN), and in the case where the first and second bonding pads BP1 and BP2 are formed of copper (Cu), the first and second bonding pads BP1 and BP2 may be physically and electrically connected to each other in a copper (Cu)-copper (Cu) bonding manner. Further, surfaces of the insulating layers of the capacitor layer PDC and the power delivery network PDN may be bonded to each other in a dielectric-dielectric bonding manner.

For the bonding between the first and second bonding pads BP1 and BP2, pressure and heat may be applied to the second semiconductor substrate 20. For example, the first and second bonding pads BP1 and BP2 may be treated by an annealing process, which is performed at a temperature of about 100° C. to 500° C. under pressure lower than about 30 MPa. However, the inventive concepts are not limited to this example, and the pressure and temperature conditions for the bonding process may be variously changed.

After the bonding between the first and second bonding pads BP1 and BP2, a cutting process may be performed along the scribe line region to separate the chip regions CR of the first and second semiconductor substrates 10 and 20 from each other, and thus the semiconductor package 100 may be formed to have the same structure as described with reference to FIG. 3. Here, the cutting process may be performed using a sawing blade or a laser beam.

Figure 16:
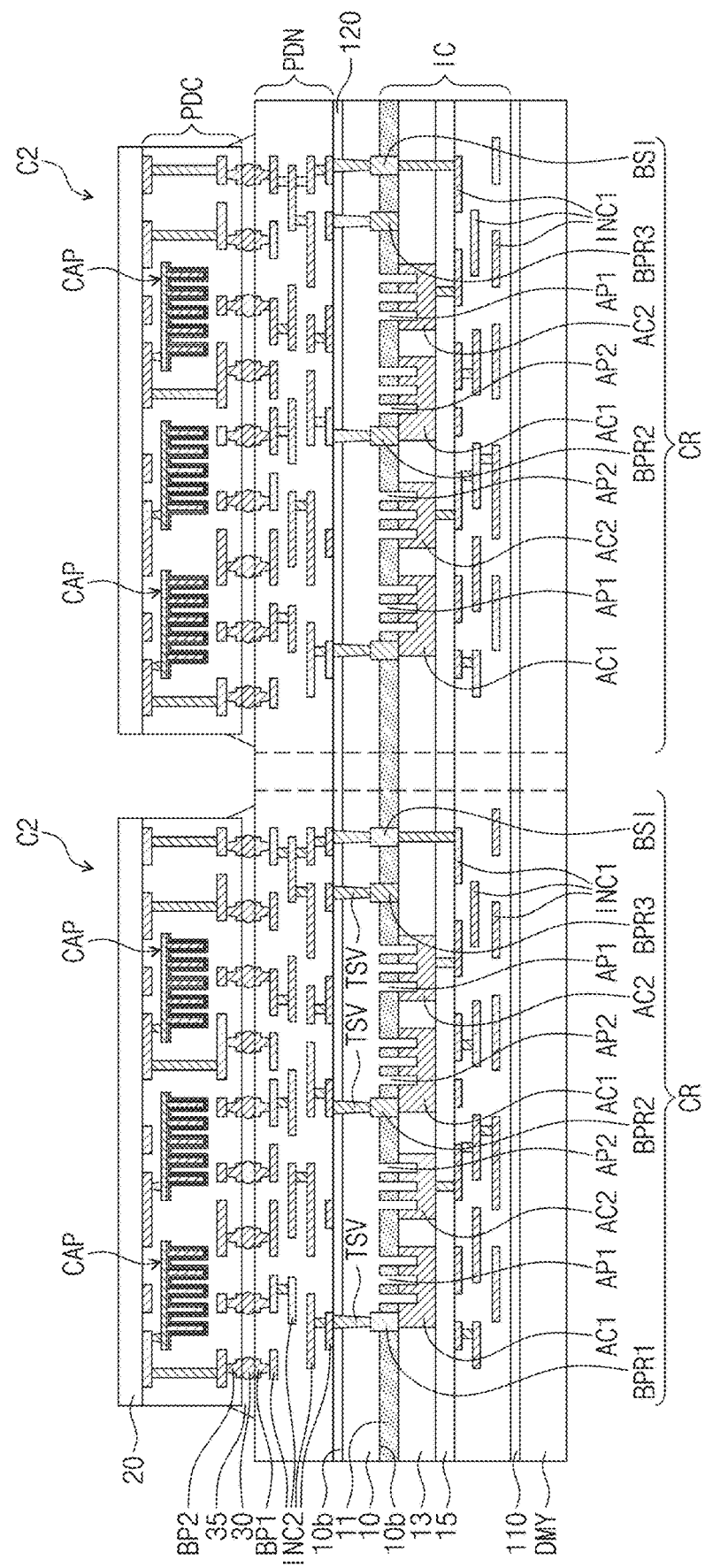
FIG. 16 is a sectional view illustrating a method of fabricating a semiconductor package, according to an example embodiment of the inventive concepts.

FIG. 16 is a sectional view illustrating a method of fabricating a semiconductor package, according to an example embodiment of the inventive concepts.

Referring to FIG. 16, the first semiconductor substrate 10, on which the logic structure IC and the power delivery network PDN are formed, may be provided, as described with reference to FIGS. 12 to 14.

A plurality of second semiconductor chips C2 may be provided on the chip regions CR of the first semiconductor substrate 10, respectively. Each of the second semiconductor chips C2 may include the second semiconductor substrate 20 and the capacitor layer PDC on the second semiconductor substrate 20, as described above, and the second bonding pads BP2 may be disposed in the lowermost metal layer of the capacitor layer PDC.

The second semiconductor chips C2 may be provided in such a way that the second bonding pads BP2 thereof face the first bonding pads BP1 on the first semiconductor substrate 10. The first and second bonding pads BP1 and BP2 may be connected to each other through the connection terminals 30.

Next, the under-fill layer 35 may be formed to fill a space between the power delivery network PDN and the capacitor layer PDC, and the mold layer 50 (e.g., see FIG. 5A) may be formed on the insulating layer of the power delivery network PDN.

The mold layer 50 (e.g., see FIG. 5A) may be formed to thickly cover the second semiconductor chips C2, and then a grinding process may be performed to expose the second semiconductor substrate 20.

After the formation of the mold layer 50, a cutting process may be performed along the scribe line region to form the semiconductor package 100 described with reference to FIG. 5A or 5B.

Figure 17:
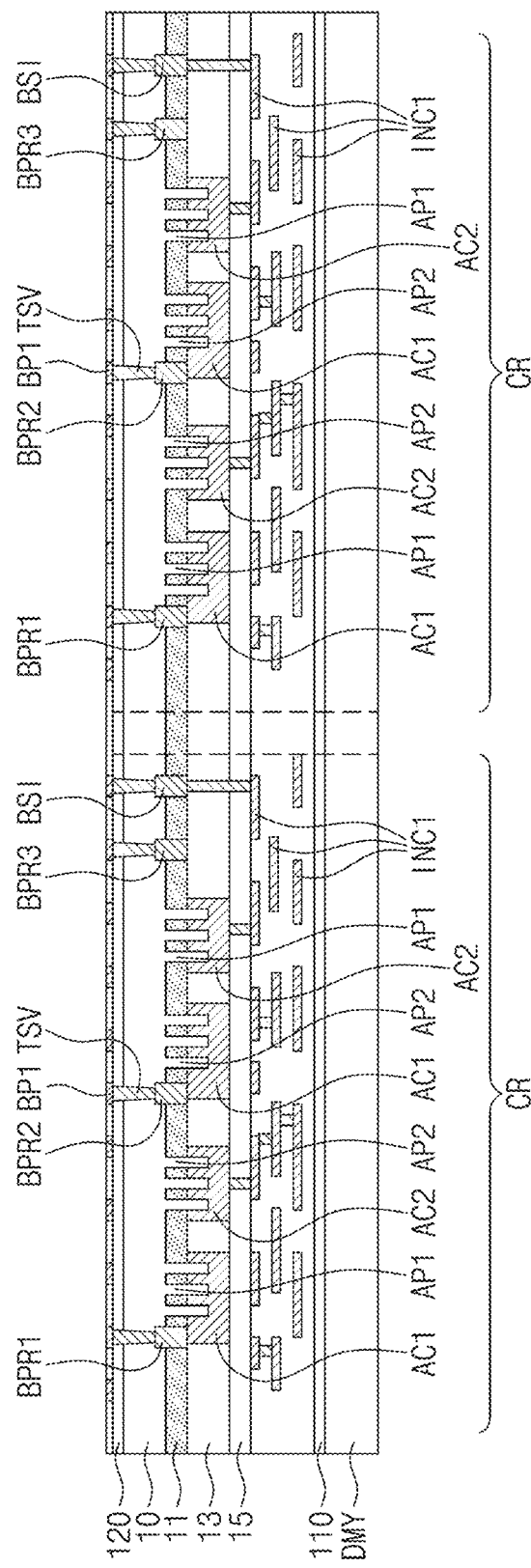
FIGS. 17 and 18 are sectional views illustrating a method of fabricating a semiconductor package, according to an example embodiment of the inventive concepts.
Figure 18:
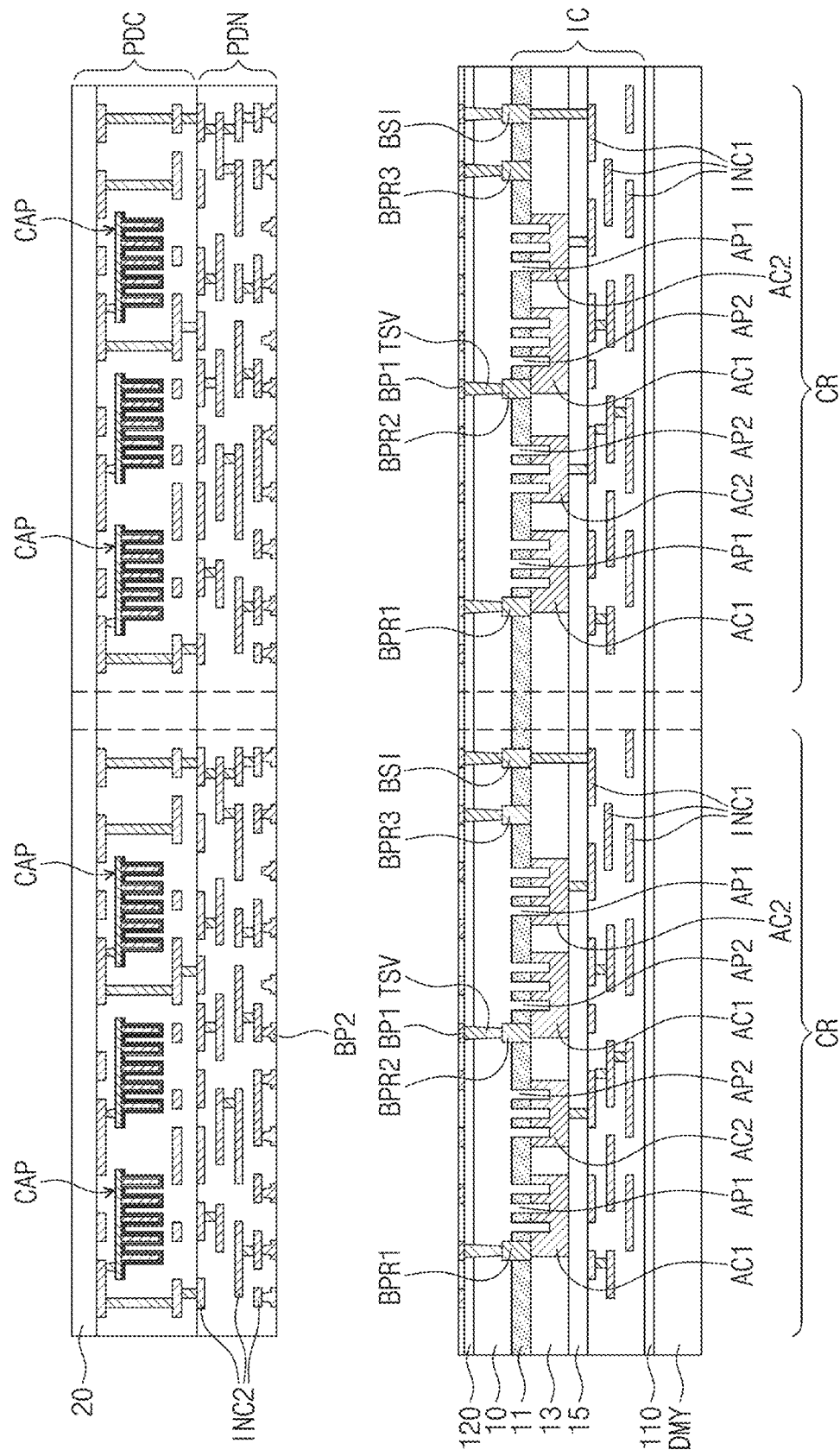

FIGS. 17 and 18 are sectional views illustrating a method of fabricating a semiconductor package, according to an example embodiment of the inventive concepts.

Referring to FIG. 17, the logic structure IC may be formed on the first surface 10a of the first semiconductor substrate 10, as previously described with reference to FIGS. 11 to 13, and then, the penetration vias TSV may be formed to penetrate the first semiconductor substrate 10 and to be connected to the first, second, and third buried power rails BPR1, BPR2, and BPR3.

After the formation of the penetration vias TSV, the first bonding pads BP1 may be formed on the second surface 10b of the first semiconductor substrate 10. Some of the first bonding pads BP1 may be connected to the penetration vias TSV.

Referring to FIG. 18, the second semiconductor substrate 20, on which the capacitor layer PDC and the power delivery network PDN are formed, may be provided on the first semiconductor substrate 10.

The capacitor layer PDC, which includes the power decoupling capacitors CAP, may be formed on a front surface of the second semiconductor substrate 20 (e.g., a first surface of the second semiconductor substrate 20 facing the power delivery network PDN), and the power delivery network PDN, which includes the power lines INC2 electrically connected to the power decoupling capacitors CAP, may be formed on the capacitor layer PDC. The lowermost metal layer of the power delivery network PDN may be formed to include the second bonding pads BP2.

Next, the first semiconductor substrate 10 and the second semiconductor substrate 20 may be bonded to each other such that the first bonding pads BP1 of the first semiconductor substrate 10 are in direct contact with the second bonding pads BP2 of the second semiconductor substrate 20. Accordingly, the power lines INC2 may be electrically connected to the buried power rails BPR1, BPR2, and BPR3 through the first and second bonding pads BP1 and BP2 and the penetration vias TSV.

After the bonding between the first and second bonding pads BP1 and BP2, a cutting process may be performed along the scribe line region to separate the chip regions CR of the first and second semiconductor substrates 10 and 20 from each other, and thus the semiconductor package 100 may be formed to have the same structure as described with reference to FIGS. 6 and 7.

FIGS. 19 to 22 are sectional views illustrating a method of fabricating a semiconductor package, according to an example embodiment of the inventive concepts.

Figure 19:
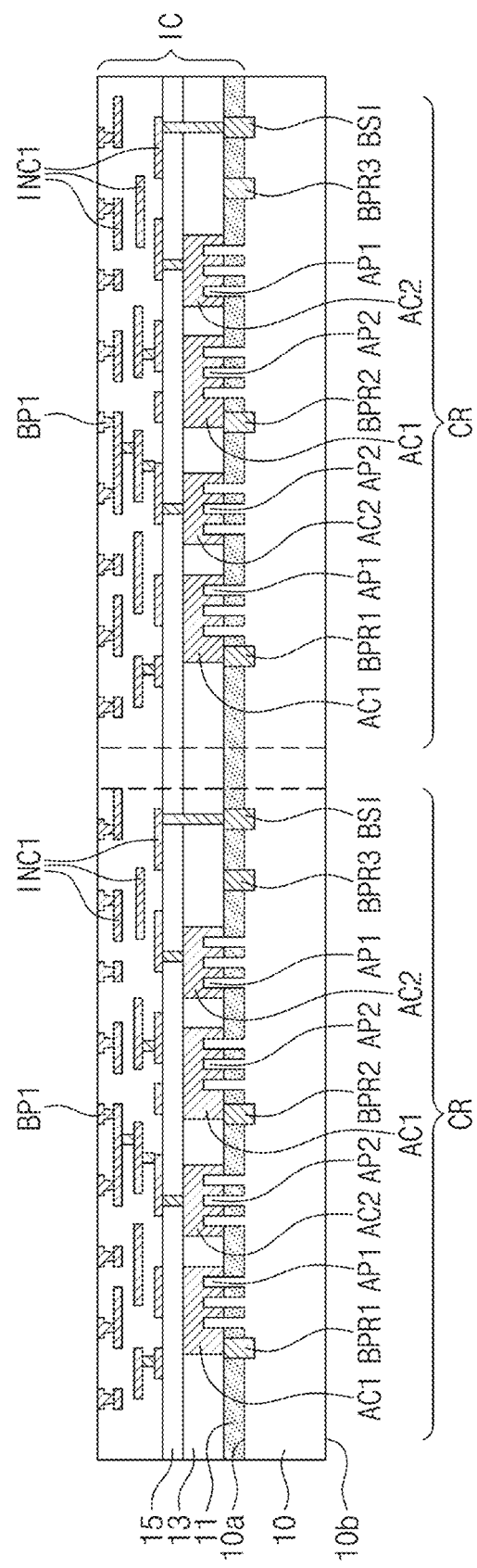
FIGS. 19 to 22 are sectional views illustrating a method of fabricating a semiconductor package, according to an example embodiment of the inventive concepts.

Referring to FIG. 19, the logic structure IC may be formed on the first surface 10a of the first semiconductor substrate 10, as described with reference to FIGS. 10 and 11.

The signal lines INC1 may be formed on the first surface 10a of the first semiconductor substrate 10, and the first bonding pads BP1 may be formed in the uppermost metal layer of the signal lines INC1.

Figure 20:
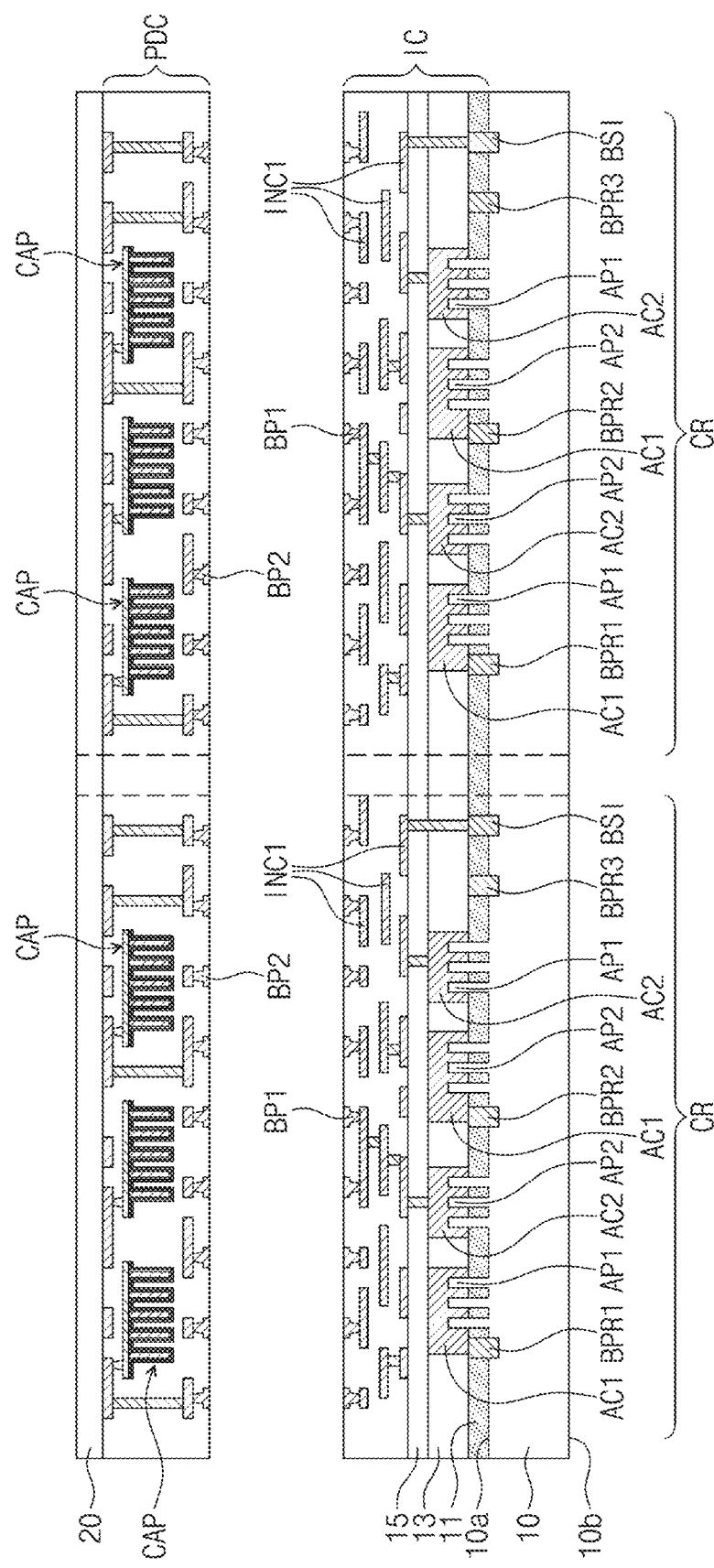

Referring to FIG. 20, the second semiconductor substrate 20 including the capacitor layer PDC may be provided on the first semiconductor substrate 10.

The capacitor layer PDC may include the power decoupling capacitors CAP, and the lowermost metal layer of the capacitor layer PDC may include the second bonding pads BP2 connected to the power decoupling capacitors CAP.

The first semiconductor substrate 10 and the second semiconductor substrate 20 may be bonded to each other such that the first bonding pads BP1 in the logic structure IC are directly bonded to the second bonding pads BP2 in the capacitor layer PDC.

Figure 21:
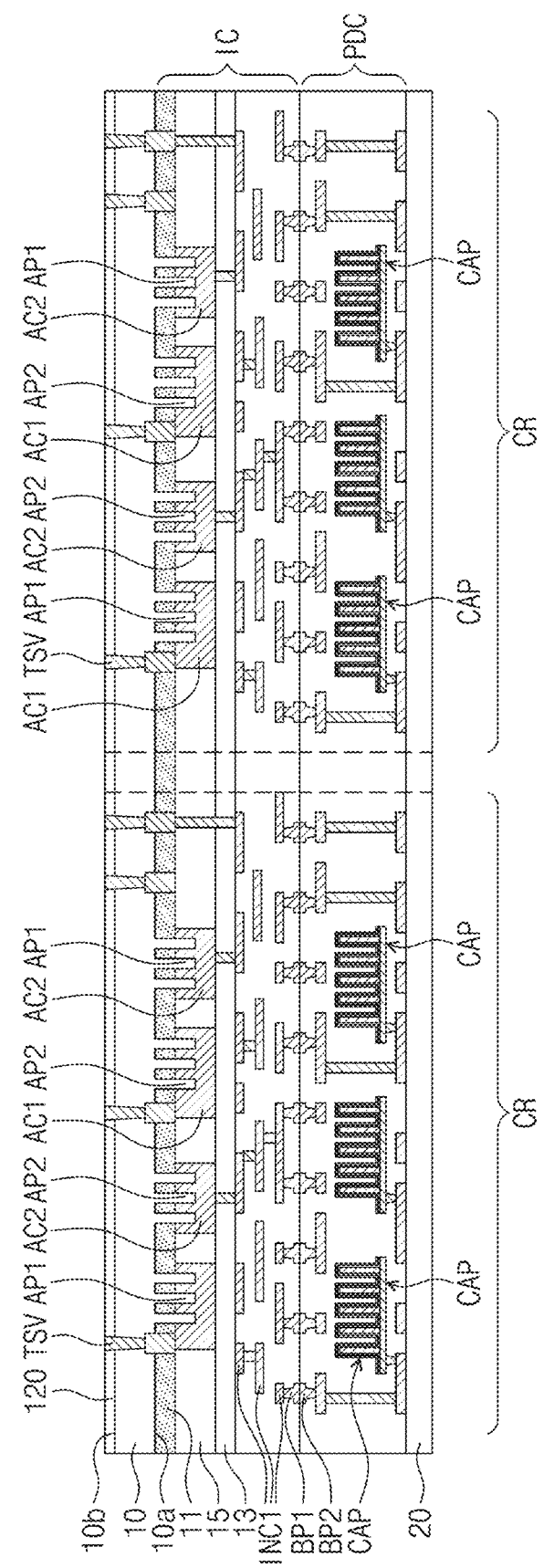

Next, referring to FIG. 21, the first semiconductor substrate 10 may be vertically inverted, and then a thinning process may be performed on the first semiconductor substrate 10, as described with reference to FIG. 13.

After the thinning process, the surface insulating layer 120 may be formed on the second surface 10b of the first semiconductor substrate 10. Next, the second surface 10b of the first semiconductor substrate 10 may be patterned to form the penetration vias TSV, which are electrically connected to the first, second, and third buried power rails BPR1, BPR2, and BPR3 and the buried signal line BSI.

Figure 22:
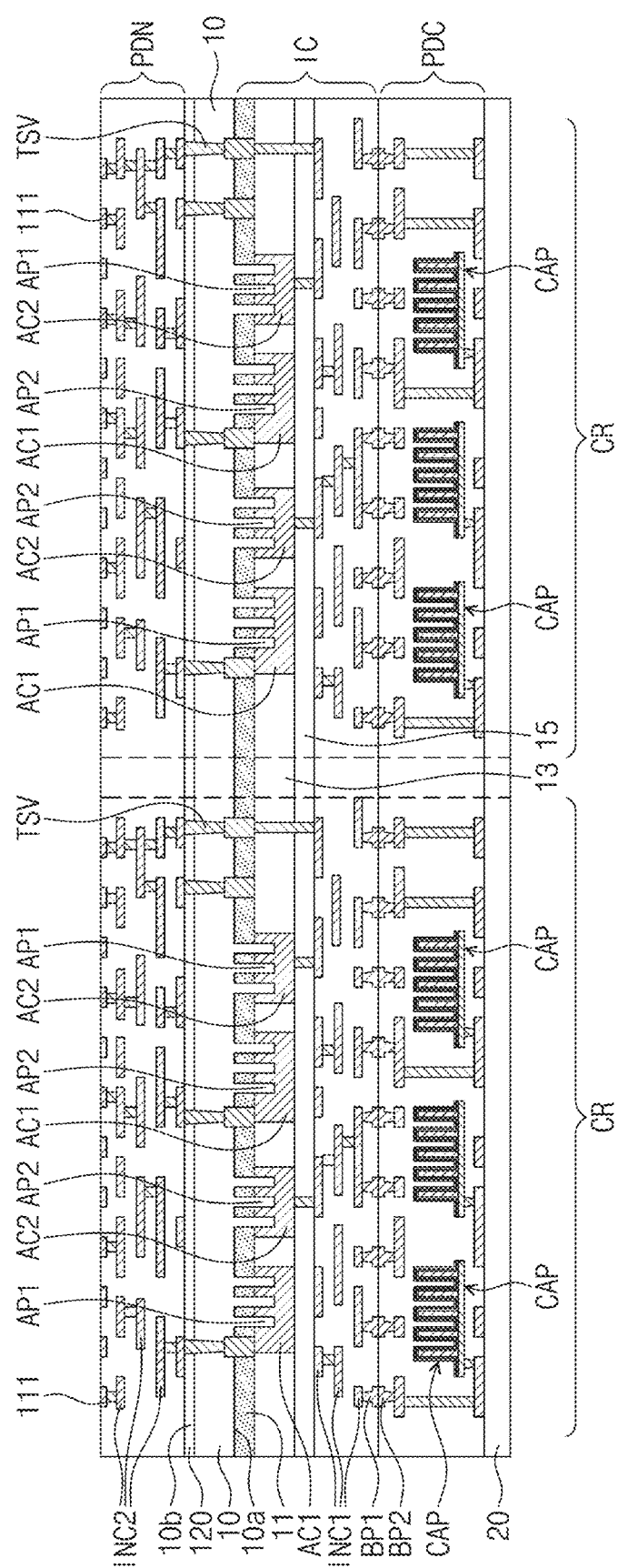

Referring to FIG. 22, the power delivery network PDN, which is electrically connected to the penetration vias TSV, may be formed on the surface insulating layer 120. The formation of the power delivery network PDN may include forming insulating layers and the power lines INC2, which are interposed between the insulating layers, on the surface insulating layer 120.

The chip pads 111 may be formed in the uppermost metal layer of the power delivery network PDN and on each chip region CR. After the formation of the chip pads 111, a cutting process may be performed along the scribe line region. Accordingly, the semiconductor package 100 may be formed to have the same structure as described with reference to FIGS. 8 and 9.

According to an example embodiment of the inventive concepts, a power decoupling capacitor may be provided adjacent to a power delivery network. Accordingly, when a semiconductor package executes a high frequency operation, a power noise may be reduced. Thus, operation characteristics of the semiconductor package may be improved.

According to an example embodiment of the inventive concepts, a second semiconductor chip including the power decoupling capacitor may be bonded to a first surface of a first semiconductor substrate, on which a logic structure is integrated, and then the power delivery network may be formed on a second surface of the first semiconductor substrate. That is, a dummy substrate is not needed to form the power delivery network on the second surface of the first semiconductor substrate.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
a logic structure on a first surface of a first semiconductor substrate, the logic structure including
active patterns on the first surface of the first semiconductor substrate,
buried power rails in the first semiconductor substrate, and
active contacts connecting the buried power rails to the active patterns;
a capacitor layer including power decoupling capacitors on a second semiconductor substrate; and
a power delivery network connected to the logic structure and the capacitor layer, the power delivery network being on a second surface of the first semiconductor substrate, the second surface being opposite to the first surface,
wherein the first semiconductor substrate includes penetration vias penetrating therethrough, and the penetration vias connects the buried power rails in the logic structure to the power delivery network.

2. The semiconductor package of claim 1, wherein
the power delivery network comprises power lines on the second surface of the first semiconductor substrate, the first surface facing the power delivery network, and
the capacitor layer is between the power delivery network and the second semiconductor substrate.

3. The semiconductor package of claim 1, wherein
the power delivery network comprises,
power lines on the second surface of the first semiconductor substrate, the first surface facing the power delivery network, and
first bonding pads connected to the power lines,
the capacitor layer comprises second bonding pads connected to the power decoupling capacitors, and
the first bonding pads are bonded to the second bonding pads.

4. The semiconductor package of claim 1, further comprising:
first bonding pads on the second surface of the first semiconductor substrate and connected to the logic structure through the penetration vias, the first semiconductor substrate facing the power delivery network, wherein the power delivery network comprises,
power lines on the capacitor layer, and
second bonding pads bonded to the first bonding pads, the second bonding pads connected to the power lines through the first bonding pads.

5. The semiconductor package of claim 1, wherein
the logic structure comprises,
logic devices on the first semiconductor substrate,
signal lines connected to the logic devices, and
first bonding pads connected to the signal lines,
the capacitor layer comprises second bonding pads connected to the power decoupling capacitors, and
the first bonding pads are bonded to the second bonding pads.

6. The semiconductor package of claim 1, wherein the penetration vias have a diameter ranging from 50 nm to 150 nm and a vertical length ranging from 300 nm to 1 μm.

7. The semiconductor package of claim 1, wherein each of the power decoupling capacitors comprises:
a bottom electrode pad on the second semiconductor substrate;
a plurality of bottom electrodes on the bottom electrode pad;
a capacitor dielectric layer covering the bottom electrodes with a uniform thickness; and
a top electrode on the capacitor dielectric layer, the top electrode covering an entirety of the bottom electrodes.

8. A semiconductor package, comprising:
a first chip including
a first semiconductor substrate including a first surface and a second surface opposite to the first surface,
a logic structure on the first surface, the logic structure including
active patterns on the first surface of the first semiconductor substrate,
buried power rails in the first semiconductor substrate, and
active contacts connecting the buried power rails to the active patterns,
a power delivery network on the second surface and connected to the logic structure,
penetration vias penetrating the first semiconductor substrate and connecting the buried power rails in the logic structure to the power delivery network, and
first bonding pads connected to the power delivery network; and
a second chip including a plurality of power decoupling capacitors and second bonding pads connected to the plurality of power decoupling capacitors,
wherein the first and second bonding pads are bonded to each other, and
the power decoupling capacitors face the power delivery network.

9. The semiconductor package of claim 8, wherein the logic structure further comprises:
signal lines on the active contacts and connected to the active contacts,
wherein the buried power rails are connected to the active patterns.

10. The semiconductor package of claim 9, wherein the power delivery network comprises power lines connected to the penetration vias.

11. The semiconductor package of claim 9, wherein the power delivery network is on the second surface of the first semiconductor substrate, and the power delivery network comprises power lines connected to the penetration vias.

12. The semiconductor package of claim 8, wherein the plurality of power decoupling capacitors comprises:
- a plurality of bottom electrodes on a second semiconductor substrate;
- a capacitor dielectric layer covering surfaces of the plurality of bottom electrodes; and
- a top electrode on the capacitor dielectric layer.

13. The semiconductor package of claim 12, wherein each of the bottom electrodes includes a bottom portion and a sidewall portion, which is vertically extended from the bottom portion to define an empty space.

14. The semiconductor package of claim 12, wherein each of the bottom electrodes has a pillar shape perpendicular to a top surface of the second semiconductor substrate.

15. The semiconductor package of claim 8, wherein the plurality of power decoupling capacitors comprises:
- a bottom electrode on a second semiconductor substrate;
- a top electrode; and
- a capacitor dielectric layer between the bottom electrode and the top electrode,
- wherein the bottom electrode, the capacitor dielectric layer, and the top electrode are parallel to a top surface of the second semiconductor substrate.

16. A semiconductor package, comprising:
- a first chip comprising
  - active patterns on a first surface of a first semiconductor substrate,
  - buried power rails in the first semiconductor substrate,
  - active contacts connecting the buried power rails to the active patterns,
  - a power delivery network on a second surface of the first semiconductor substrate, the second surface being opposite to the first surface, and
  - penetration vias penetrating the first semiconductor substrate and connecting the buried power rails to the power delivery network; and
- a second chip bonded to the first chip, the second chip comprising a capacitor layer that is on a second semiconductor substrate and is adjacent to the power delivery network.

17. The semiconductor package of claim 16, wherein the capacitor layer comprises:
- a bottom electrode pad on the second semiconductor substrate;
- a plurality of bottom electrodes on the bottom electrode pad;
- a capacitor dielectric layer covering the bottom electrodes with a uniform thickness; and
- a top electrode on the capacitor dielectric layer, the top electrode covering an entirety of the bottom electrodes.

18. The semiconductor package of claim 16, wherein
the first chip further comprises a device isolation layer between the active patterns,
a top surface of the device isolation layer is lower than top surfaces of the active patterns, and
the buried power rails are in the device isolation layer.

19. The semiconductor package of claim 16, wherein
the first chip further comprises a plurality of first bonding pads connected to the power delivery network, and
the second chip further comprises a plurality of second bonding pads bonded to the plurality of first bonding pads.

* * * * *